(12) United States Patent
Cho et al.

(10) Patent No.: US 12,300,584 B2
(45) Date of Patent: May 13, 2025

(54) SEMICONDUCTOR DEVICE INCLUDING HEAT SINK WITH EXPOSED SIDE FROM ENCAPSULANT AND A METHOD OF MANUFACTURING THEREOF

(71) Applicant: Amkor Technology Singapore Holding Pte. Ltd., Singapore (SG)

(72) Inventors: Hyung Jun Cho, Incheon (KR); Kyoung Yeon Lee, Incheon (KR); Tae Yong Lee, Gyeonggi-do (KR); Jae Min Bae, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 18/587,836

(22) Filed: Feb. 26, 2024

(65) Prior Publication Data
US 2024/0274512 A1    Aug. 15, 2024

Related U.S. Application Data

(63) Continuation of application No. 17/887,151, filed on Aug. 12, 2022, now Pat. No. 11,915,998, which is a
(Continued)

(51) Int. Cl.
*H01L 23/495* (2006.01)
*H01L 21/48* (2006.01)
(Continued)

(52) U.S. Cl.
CPC .... *H01L 23/49568* (2013.01); *H01L 21/4825* (2013.01); *H01L 21/563* (2013.01);
(Continued)

(58) Field of Classification Search
CPC . H01L 21/4825; H01L 21/561; H01L 21/563; H01L 21/565; H01L 21/6835; H01L 21/78; H01L 29/3121; H01L 29/3135; H01L 29/36; H01L 29/367; H01L 29/495; H01L 29/49503; H01L 29/4952;
(Continued)

(56) References Cited

U.S. PATENT DOCUMENTS

2005/0012183 A1    1/2005 Chow et al.
2007/0065984 A1*    3/2007 Lau .................. H01L 23/3107
                                                 257/E23.092

(Continued)

OTHER PUBLICATIONS

Amkor Data Sheet—Leadframe CSP, revised Sep. 2012.
Technology Solutions, Chip-on-Chip POSSUM Technology, Revised Oct. 2016.

*Primary Examiner* — Cheung Lee
(74) *Attorney, Agent, or Firm* — Spectrum IP Law Group LLC

(57) ABSTRACT

In one example, a semiconductor device comprises a substrate having a top surface and a bottom surface, an electronic device on the bottom surface of the substrate, a leadframe on the bottom surface of the substrate, the leadframe comprising a paddle, wherein the paddle is coupled to the electronic device, and a lead electrically coupled to the electronic device. The semiconductor device further comprises a first protective material contacting the bottom surface of the substrate and a side surface of the electronic device.

20 Claims, 18 Drawing Sheets

Related U.S. Application Data continuation of application No. 17/099,968, filed on Nov. 17, 2020, now Pat. No. 11,417,589, which is a continuation of application No. 16/275,784, filed on Feb. 14, 2019, now Pat. No. 10,840,169.

(51) Int. Cl.

| | |
|---|---|
| *H01L 21/56* | (2006.01) |
| *H01L 21/683* | (2006.01) |
| *H01L 21/78* | (2006.01) |
| *H01L 23/31* | (2006.01) |
| *H01L 23/36* | (2006.01) |

(52) U.S. Cl.
CPC ........ *H01L 21/565* (2013.01); *H01L 21/6835* (2013.01); *H01L 21/78* (2013.01); *H01L 23/3135* (2013.01); *H01L 23/36* (2013.01); *H01L 23/495* (2013.01); *H01L 23/49503* (2013.01); *H01L 23/4952* (2013.01); *H01L 23/49531* (2013.01); *H01L 23/49551* (2013.01); *H01L 23/49575* (2013.01); *H01L 23/3121* (2013.01); *H01L 2221/68359* (2013.01)

(58) Field of Classification Search
CPC ......... H01L 29/49531; H01L 29/49537; H01L 29/49551; H01L 29/49568; H01L 29/49575; H01L 21/36; H01L 2221/68359; H01L 2924/181; H01L 23/3121; H01L 23/3135; H01L 23/36; H01L 23/367; H01L 23/495; H01L 23/49503; H01L 23/4952; H01L 23/49531; H01L 23/49537; H01L 23/49551; H01L 23/49568; H01L 23/49575

See application file for complete search history.

(56) References Cited

U.S. PATENT DOCUMENTS

| | | |
|---|---|---|
| 2007/0209834 A1 | 9/2007 | Kuan et al. |
| 2007/0210424 A1 | 9/2007 | Ho et al. |
| 2014/0239479 A1* | 8/2014 | Start ................. H01L 21/56 257/706 |
| 2019/0259689 A1* | 8/2019 | Lui ................... H05K 1/0265 |

\* cited by examiner

SEMICONDUCTOR DEVICE INCLUDING HEAT SINK WITH EXPOSED SIDE FROM ENCAPSULANT AND A METHOD OF MANUFACTURING THEREOF

CROSS-REFERENCE TO RELATED APPLICATIONS

The present application is a continuation of U.S. application Ser. No. 17/887,151 filed Aug. 12, 2022, pending, which is a continuation of U.S. application Ser. No. 17/099,968 filed Nov. 17, 2020, now U.S. Pat. No. 11,417,589, which is a continuation of U.S. application Ser. No. 16/275,784 filed Feb. 14, 2019, now Pat. App. No. 10,840,169. Said application Ser. No. 17/887,151, said application Ser. No. 17/099,968, said application Ser. No. 16/275,784, said U.S. Pat. No. 11,417,589, and said U.S. Pat. No. 10,840,169 are hereby incorporated herein by reference in their entireties.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
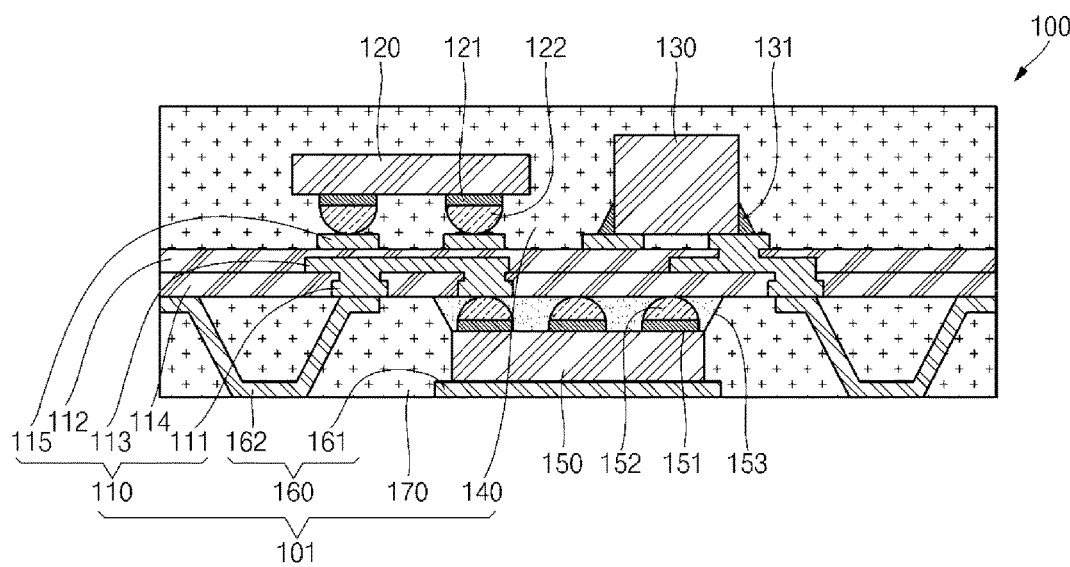
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The terms "and/or" include any single item, or any combination of the items, in the list joined by "and/or". As used in this disclosure, the singular forms are intended to include the plural forms as well, unless the context clearly indicates otherwise.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. In some examples, the term "coupled" may refer to physical coupling, electrical coupling, or thermal coupling, or a combination thereof. Similarly, the terms "over" or "on" may be used to describe two elements directly contacting each other or describe two elements indirectly connected by one or more other elements.

DESCRIPTION

In accordance with one or more examples, a semiconductor device comprises a substrate having a top surface and a bottom surface, an electronic device on the bottom surface of the substrate, and a leadframe on the bottom surface of the substrate. The leadframe comprises a paddle, wherein the paddle is coupled to the electronic device, and a lead electrically coupled to the electronic device. The semiconductor device further comprises a first protective material contacting the bottom surface of the substrate and a side surface of the electronic device.

In accordance with one or more additional examples, a method of manufacturing a semiconductor device comprises placing a plurality of electronic devices on a bottom surface of a substrate strip, placing a leadframe on the bottom surface of the substrate strip, wherein the leadframe comprises a plurality of paddles and a plurality of leads, wherein a paddle of the plurality of paddles contacts an electronic device of the plurality of electronic devices and a lead of the plurality of leads is electrically coupled to an electronic device of the plurality of electronic devices, and forming a first protective material on the bottom surface of the substrate strip to contact a side surface of an electronic device.

In accordance with one or more further examples, a semiconductor device, comprises a substrate having a top surface and a bottom surface, a first electronic device on the top surface of the substrate, a second electronic device on the bottom surface of the substrate, a heat sink thermally coupled to the second electronic device, a contact electrically coupled to the second electronic device, and a mold compound contacting the bottom surface of the substrate and a side surface of the second electronic device, wherein a surface of the contact is substantially coplanar to a surface of the heat sink and a surface of the mold compound.

Other examples are included in the present disclosure. Such examples may be found in the figures, in the claims, and/or in the description of the present disclosure.

FIG. 1 shows a cross-sectional view of an example semiconductor device (100). In the example shown in FIG. 1, semiconductor device 100 can include a substrate 110, electronic devices 120 and 150, a passive device 130, a leadframe 160, and encapsulants 140 and 170. In general, the term electronic device may refer to any type of electronic device or component including active devices and semiconductor devices, discrete devices or integrated devices, or passive devices including resistors, capacitors, inductors, antennas, transmission lines, baluns, transformers, and so on, and the scope of the disclosed subject matter is not limited in these respects.

Substrate 110 can include dielectric layers 112 and 114 and conductive layers 111, 113 and 115. Electronic devices 120 and 150 can include interconnects 121 and 151, respectively. Interconnects 121 and 151 of electronic devices 120 and 150 can be located on bottom or top surfaces of electronic devices 120 and 150. Interconnects 121 and 151 can be made of conductive materials and can be electrically connected to conductive layers 111 and 115 of substrate 110, respectively. Further, an underfill 153 can be interposed between the top surface of electronic device 150 and the bottom surface of substrate 110. Although semiconductor device 100 is shown as including two electronic devices 120 and 150, this is not a limitation of the present disclosure. In other examples, semiconductor device 100 can include a single electronic device or three or more electronic devices, whether on the top and/or bottom of substrate 110.

Passive device 130 can include a terminal 131. Terminal 131 of passive device 130 can be electrically connected to conductive layer 111 of substrate 110. Although semiconductor device 100 is shown as including a single passive device 130 on the top of substrate 110, this is not a limitation of the present disclosure. In other examples, semiconductor device 100 can include one or more passive devices, whether on the top and/or bottom of substrate 110.

Leadframe 160 can include a paddle 161 covering a bottom surface of electronic device 150 and a lead 162 electrically connected to conductive layer 111 of substrate 110. Paddle 161 can be referred to as a heat sink or thermally conductive element, and the scope of the disclosed subject matter is not limited in this respect. Paddle 161 and lead 162 of leadframe 160 can be exposed to the outside through a bottom surface of encapsulant 170. A plurality of leads 162 exposed to the outside through a bottom surface of encapsulant 170 can be arranged on the same row to be spaced apart from each other. The plurality of leads 162 exposed to the outside through a bottom surface of encapsulant 170 can be arranged on a single row or column to be parallel with the outer periphery of encapsulant 170. The exposed surface of lead 162 can be substantially coplanar to the exposed surface of paddle 161 and the bottom surface of encapsulant 170 and a portion of encapsulant 170 is between a portion of lead 162 and a portion of substrate 110 wherein the flatness of paddle 161 can be 0.005 mm per 2.54 mm traverse distance of across paddle 161 when measuring from the center of paddle 161 to the average distance to the four corners of paddle. In some examples, a maximum allowable flatness of paddle 161 is not to exceed a total of 0.020 mm, and a maximum coplanarity of lead 162 is not to exceed 0.076 mm. In some examples, no solder balls or solder bumps are included in semiconductor device 100 and leads 162 can be configured to be soldered directly to a printed circuit board (not shown) without the use of solder balls or solder bumps. It is noted that these examples are one or many possible examples, and the scope of the disclosure is not limited in these respects.

Encapsulant 140 can encapsulate electronic device 120 and passive device 130 positioned on the top surface of substrate 110. In addition, encapsulant 170 can encapsulate electronic device 150 and leadframe 160 positioned on the bottom surface of substrate 110. In other examples, encapsulant 170 can be referred to as a protective material or a mold compound or mold material and can completely or at least partially cover or enclose one or more electronic devices. In some examples, although the term encapsulant can be used, the encapsulant, protective material, mold compound, or mold material does not completely cover or enclose one or more electronic devices. For example, the encapsulant, protective material, mold compound, or mold material can contact at least one or more sides or side surfaces of one or more electronic devices, and the scope of the disclosed subject matter is not limited in these respects.

Substrate 110, leadframe 160 and encapsulants 140 and 170 can be referred to as a semiconductor package 101 or a package 101. Semiconductor package 101 can protect electronic devices 120 and 150 and passive device 130 from external elements and/or environmental exposure. In addition, semiconductor package 101 can provide electrical couplings between an external component (not shown) and electronic devices 120 and 150 and between an external component (not shown) and passive device 130.

Figure 3A:
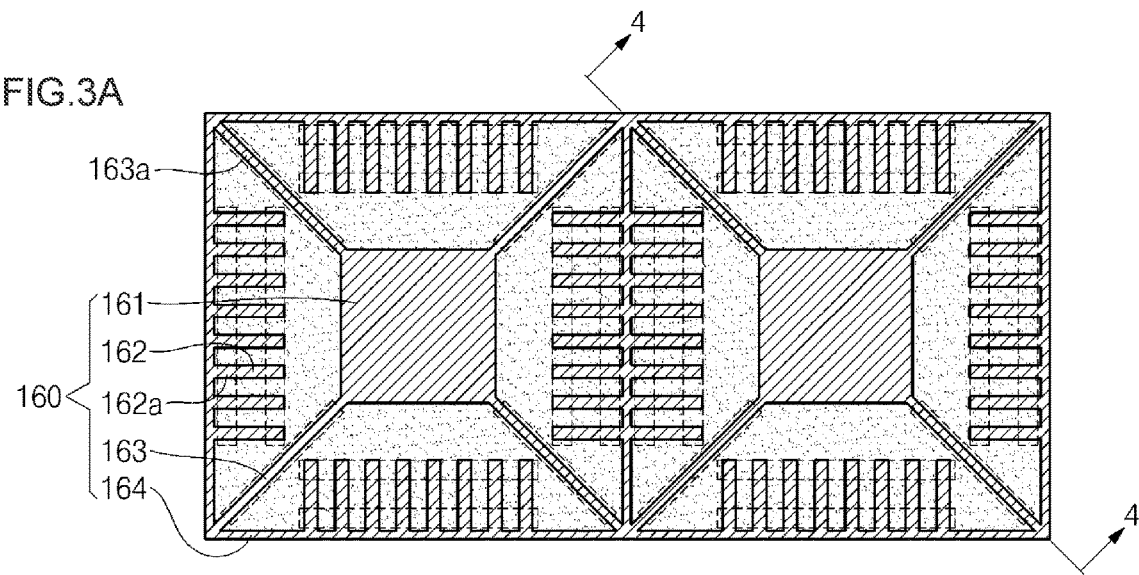
FIG. 3A to FIG. 3C show plan views of the example method for manufacturing the example semiconductor device shown in FIG. 2K to FIG. 2M.
Figure 3B:
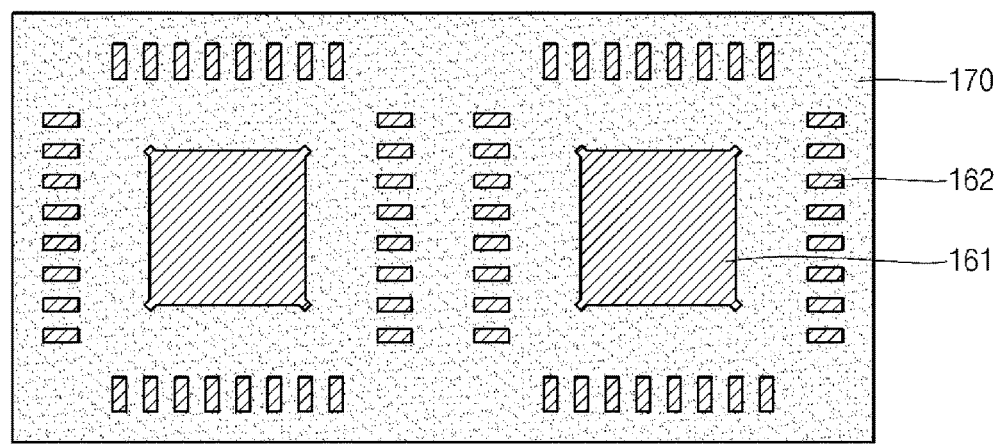
Figure 3C:
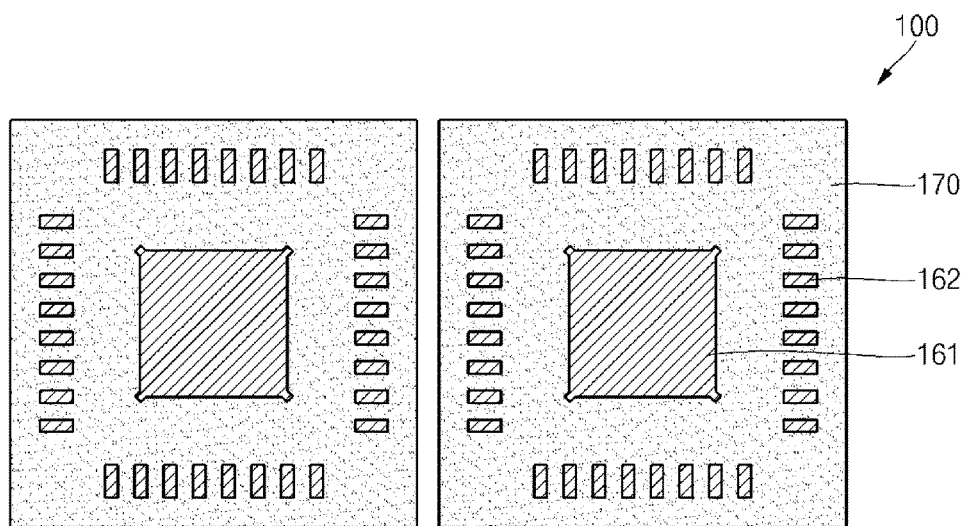
Figure 4:
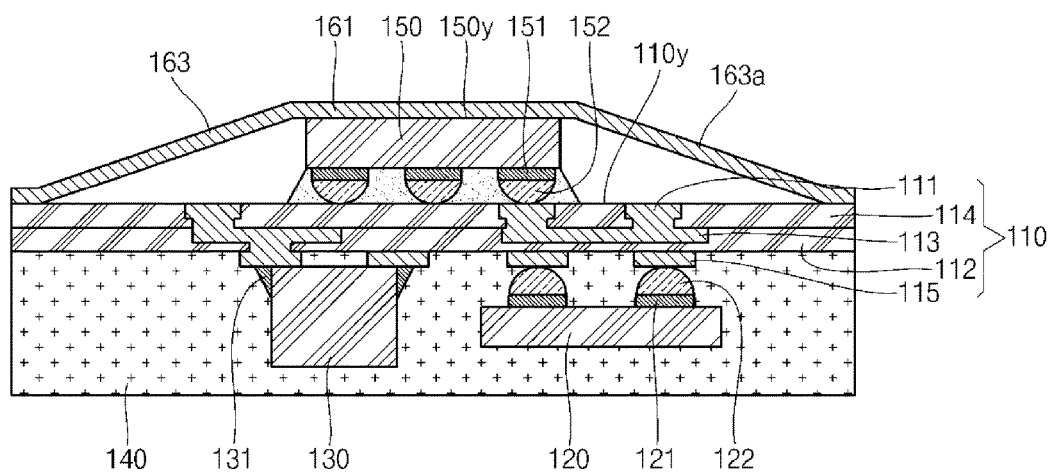
FIG. 4 shows a cross-sectional view of the example semiconductor device taken along the line 4-4 of FIG. 3A.

FIG. 2A to FIG. 2M show cross-sectional views of an example method for manufacturing semiconductor device 100. FIG. 3A to FIG. 3C show plan views of the example method for manufacturing semiconductor device 100 shown in FIG. 2K to FIG. 2M. FIG. 4 shows a cross-sectional view of semiconductor device 100 taken along the line 4-4 of FIG. 3A.

Figure 2A:
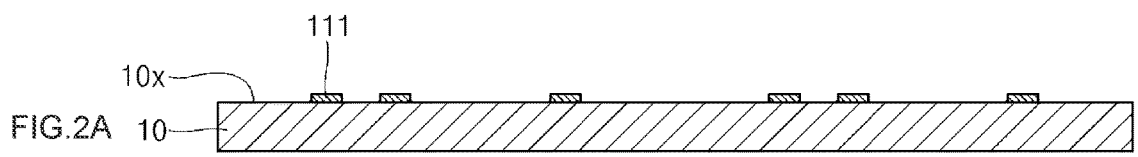
FIG. 2A to FIG. 2M show cross-sectional views of an example method for manufacturing an example semiconductor device.

FIG. 2A shows a cross-sectional view of semiconductor device 100 at an initial stage of manufacture. In the example shown in FIG. 2A, a carrier 10 can be in the shape of a substantially planar plate. In some examples, carrier 10 can be referred to as a board, a wafer, a panel or a strip. In addition, in some examples, carrier 10 can be made of one selected from the group consisting of a metal (e.g., steel or SUS), a wafer (e.g., silicon), glass (e.g., soda-lime glass) or equivalents. Carrier 10 can have a thickness in the range from approximately 50 μm to approximately 1000 μm and a width in the range from approximately 100 mm to approximately 300 mm.

Carrier 10 can function to allow forming of substrate 110, attaching electronic device 120 and passive device 130 and handling multiple components in an integrated manner. Meanwhile, carrier 10 can be commonly applied to all examples of the present disclosure.

Conductive layer 111 can be formed on carrier 10. Conductive layer 111 can be formed to have a pattern on a top surface 10x of carrier 10 by a mask (not shown) having a pattern. Conductive layer 111 can be formed to have a pattern having a circular, rectangular or polygonal planar shape. Conductive layer 111 can be made of any of a variety of conductive materials (e.g., copper, gold, silver or an equivalent). Conductive layer 111 can be referred to as a conductive pattern, a conductive pad, a wiring pattern or a circuit pattern. In addition, in some examples, conductive layer 111 can be formed using any of a variety of processes including, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), or equivalents.

After forming conductive layer 111, the mask can be removed. For example, photoresist can be used as mask. Conductive layer 111 can have a thickness in the range from approximately 0.1 µm to approximately 20 µm.

Figure 2B:
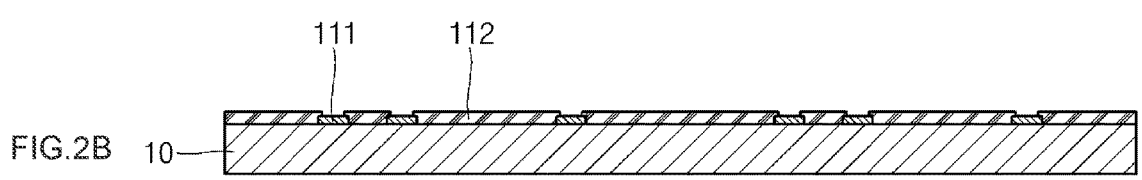

FIG. 2B shows a cross-sectional view of semiconductor device 100 at a later stage of manufacture. In the example shown in FIG. 2B, dielectric layer 112 can be formed to entirely cover the top surface 10x of carrier 10 and conductive layer 111 and can expose conductive layer 111 to the outside by patterning dielectric layer 112.

For example, dielectric layer 112 can be referred to as a passivation layer, an insulation layer or a protection layer. In some examples, passivation layer 112 can include an electrically insulating material, including, for example, a polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric layer 112 can be formed using any of a variety of processes. For example, dielectric layer 112 can be formed using spin coating, spray coating, printing, PVD, CVD, MOCVD, ALD, LPCVD, or PECVD. After forming dielectric layer 112 to entirely cover the top surface 10x of carrier 10 and conductive layer 111, dielectric layer 112 can be patterned by a mask pattern to expose conductive layer 111 to the outside. For example, photoresist can be used as mask pattern. Dielectric layer 112 can have a thickness in the range from approximately 3 µm to approximately 30 µm.

Figure 2C:
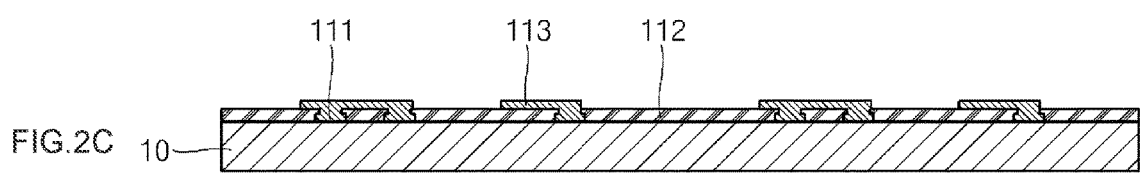

FIG. 2C shows a cross-sectional view of semiconductor device 100 at a later stage of manufacture. In the example shown in FIG. 2C, conductive layer 113 can be formed to cover conductive layer 111 and the exposed surface of dielectric layer 112.

Conductive layer 113 can be formed to have a plurality of patterns and can be electrically connected to conductive layer 111 exposed to the outside by dielectric layer 112. Conductive layer 113 can be referred to as a redistribution layer (RDL), a wiring pattern or a circuit pattern. In some examples, conductive layer 113 can be made of any of a variety of conductive materials (e.g., copper, gold, silver, or an equivalent). Conductive layer 113 can be formed using any of a variety of processes. For example, conductive layer 113 can be formed using sputtering, electroless plating, electroplating, PVD, CVD, MOCVD, ALD, LPCVD, PECVD, or equivalents. After forming conductive layer 113 to a predetermined thickness to cover conductive layer 111 and the exposed surface of dielectric layer 112, conductive layer 113 can be patterned using a mask pattern to have a plurality patterns. Conductive layer 113 can have a thickness in the range from approximately 3 µm to approximately 20 µm.

Figure 2D:
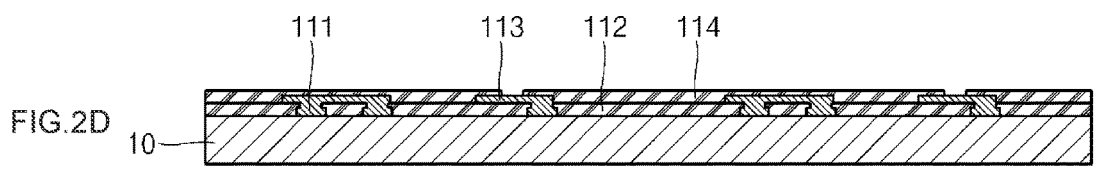

FIG. 2D shows a cross-sectional view of semiconductor device 100 at a later stage of manufacture. In the example shown in FIG. 2D, dielectric layer 114 can be formed to entirely cover conductive layer 113 and dielectric layer 112 and can be patterned to expose conductive layer 113 to the outside.

For example, dielectric layer 114 can be referred to as a passivation layer, an insulation layer, or a protection layer. In some examples, dielectric layer 114 can include, but not limited to, an electrically insulating material, including, for example, a polymer, polyimide (PI), benzocyclobutene (BCB), polybenzoxazole (PBO), bismaleimide triazine (BT), a molding material, a phenolic resin, an epoxy, silicone, or an acrylate polymer. In addition, in some examples, dielectric layer 114 can be formed using by any of a variety of processes. For example, passivation layer 114 can be formed using sputtering, electroless plating, electroplating, PVD, CVD, MOCVD, ALD, LPCVD, or PECVD. After forming dielectric layer 114 to entirely cover dielectric layer 112 and the exposed surface of conductive layer 113, dielectric layer 114 can be patterned using a mask pattern to expose conductive layer 113 to the outside. For example, photoresist can be used as mask pattern. Dielectric layer 114 can have a thickness in the range from approximately 3 µm to approximately 30 µm.

Figure 2E:
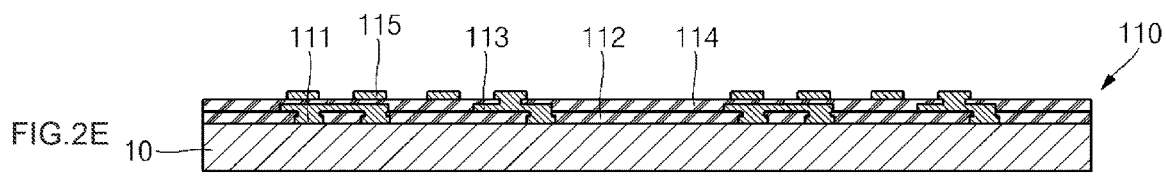

FIG. 2E shows a cross-sectional view of semiconductor device 100 at a later stage of manufacture. In the example shown in FIG. 2E, conductive layer 115 can be formed to entirely cover conductive layer 113 and the exposed surface of dielectric layer 114.

Conductive layer 115 can be formed to have a plurality of patterns and can be electrically connected to conductive layer 113 exposed to the outside by dielectric layer 114. Conductive layer 115 can be electrically connected to conductive layer 111 by conductive layer 113.

Conductive layer 115 can be referred to as a conductive pad, a micro pad, a bond pad, or an under-bump metallization (UBM). In some examples, conductive layer 115 can be made of any of a variety of conductive materials (e.g., copper, gold, silver, or an equivalent). In addition, an oxidation resistant layer (not shown) made of tin, gold, silver, nickel, palladium, or an equivalent can be further formed on conductive layer 115 for the purpose of preventing oxidation. Conductive layer 115 can be formed by any of a variety of processes including, for example, sputtering, electroless plating, electroplating, PVD, CVD, MOCVD, ALD, LPCVD, PECVD, or equivalents. After forming conductive layer 115 to a predetermined thickness to cover conductive layer 113 and the exposed surface of dielectric layer 114, conductive layer 115 can be patterned using a mask pattern to have a plurality patterns. Conductive layer 115 can have a thickness in the range from approximately 3 µm to approximately 20 µm.

Substrate 110 can be completed by forming conductive layer 115 in the aforementioned manner. Although substrate 110 is shown as including three conductive layers 111, 113, and 115 and two dielectric layers 112 and 114, this is not limitation of the present disclosure. In other examples, substrate 110 can include a single conductive layer or two or more than four conductive layers and, a single dielectric layer or more than three dielectric layers. Although substrate 110 is shown as a coreless buildup substrate, built layer upon layer on a carrier without a core layer (e.g. fiberglass layer), this is not a limitation of the present disclosure. In other examples, substrate 110 can be a printed circuit board which can include electrically conductive copper traces coupled to a core layer such as, for example, a glass fiber reinforced material. In other examples, substrate 110 can be a rigid or flexible printed circuit board, a ceramic circuit board or an interposer. In addition, when substrate 110 is a printed circuit board, semiconductor device 100 can be manufactured without using carrier 10.

Figure 2F:
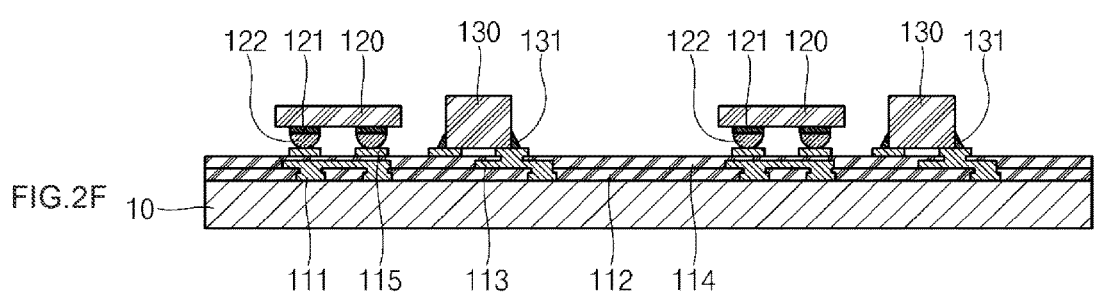

FIG. 2F shows a cross-sectional view of semiconductor device 100 at a later stage of manufacture. In the example shown in FIG. 2F, electronic device 120 and passive device 130 can be electrically connected to conductive layer 115 of substrate 110.

In some examples, pick-and-place equipment (not shown) picks up electronic device 120 and passive device 130 to be placed on conductive layer 115 of substrate 110. Next, electronic device 120 and passive device 130 can be electrically connected to conductive layer 115 of substrate 110 using, for example, a mass reflow process, a thermal compression process or a laser bonding process.

In some examples, electronic device 120 can be referred to as a semiconductor die or a semiconductor chip. In addition, in some examples, electronic device 120 can comprise at least one of a logic die, a micro control unit, a memory, a digital signal processor, a network processor, a power management unit, an audio processor, a radio-frequency (RF) circuit, a wireless baseband system on chip processor, an application specific integrated circuit, or an equivalent. In some examples, electronic device 120 can include an active region and a non-active region. In addition, in some examples, active region can be disposed to face substrate 110. In addition, in some examples, active region can include interconnects 121. In some examples, interconnects 121 can be referred to as die pads, bond pads, aluminum pads, or conductive posts.

In addition, interconnects 121 can be connected to conductive layer 115 of substrate 110 using a low melting point material 122. In an example, low melting point material 122 can include one selected from the group consisting of Sn, Ag, Pb, Cu, Sn—Pb, Sn37-Pb, Sn95-Pb, Sn—Pb—Ag, Sn—Cu, Sn—Ag, Sn—Au, Sn—Bi, Sn—Ag—Cu, or equivalents. Interconnects 121 of electronic device 120 and conductive layer 115 of substrate 110 can be electrically connected to each other using low melting point material 122. Electronic device 120 can have an overall thickness in the range from approximately 50 μm to approximately 1000 μm.

In some examples, passive device 130 can include at least one of a resistor, a capacitor, an inductor, a connector, or equivalents. In addition, passive device 130 can further include a terminal 131 and can be electrically connected to conductive layer 115 of substrate 110 through terminal 131. Passive device 130 can have an overall thickness in the range from approximately 50 μm to approximately 1000 μm. In addition, electronic device 120 and passive device 130 can include a plurality of electronic devices and a plurality of passive devices, respectively.

Figure 2G:
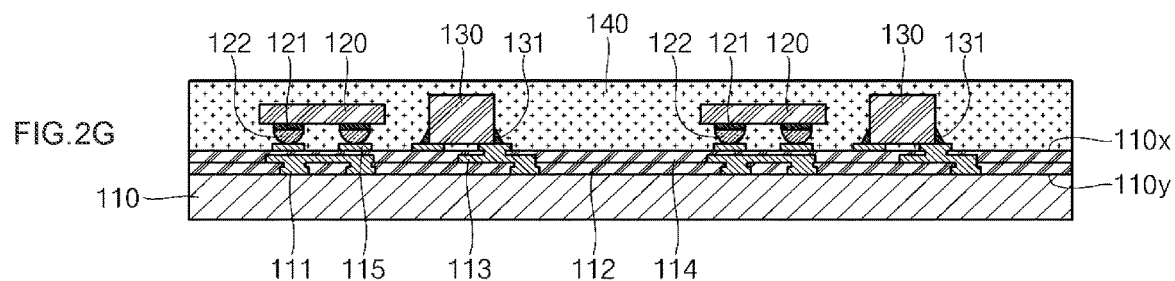

FIG. 2G shows a cross-sectional view of semiconductor device 100 at a later stage of manufacture. In the example shown in FIG. 2G, encapsulant 140 can be formed to entirely encapsulate top surface 110x of substrate 110, electronic device 120 and passive device 130. In some examples, encapsulant 140 can be referred to as an epoxy molding compound, an epoxy molding resin, or a sealant. In addition, in some examples, encapsulant 140 can be referred to as a molding part, a sealing part, an encapsulation part, a protection part, or a body. In some examples, encapsulant 140 can include, but not limited to, an organic resin, an inorganic filler, a curing agent, a catalyst, a colorant, or a flame retardant. Encapsulant 140 can be formed by any of a variety of processes. In some examples, encapsulant 140 can be formed by, but not limited to, compression molding, transfer molding, liquid-phase encapsulant molding, vacuum lamination, paste printing, or film assist molding. Encapsulant 140 can have a thickness in the range from approximately 0.2 mm to approximately 10 mm. Encapsulant 140 can encapsulate electronic device 120 and passive device 130, thereby protecting electronic device 120 and passive device 130 from external factors.

Figure 2H:
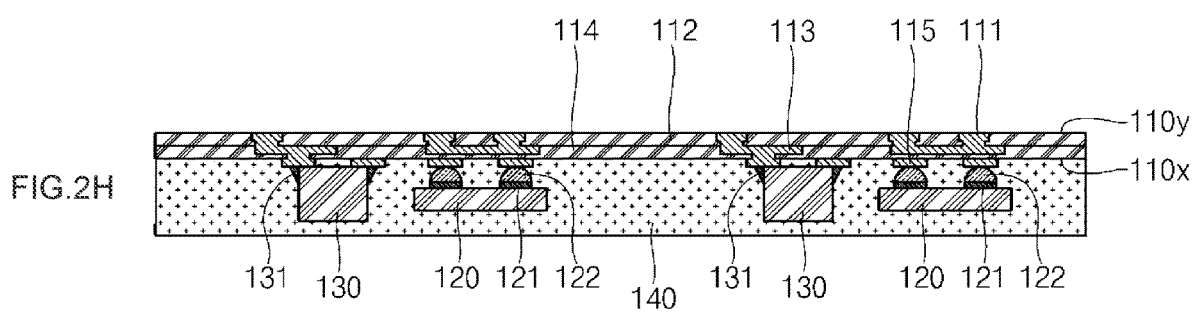

FIG. 2H shows a cross-sectional view of semiconductor device 100 at a later stage of manufacture. In the example shown in FIG. 2H, semiconductor device 100 can be flipped to allow substrate 110 to be positioned on electronic device 120, passive device 130 and encapsulant 140. As the result of the flipping, top surface 110x of substrate 110 can become a bottom surface and bottom surface 110y of substrate 110 can become a top surface. In addition, carrier 10 can be positioned on substrate 110. In addition, electronic device 120, passive device 130 and encapsulant 140 can be formed on bottom surface 110x of substrate 110.

Additionally, top surface 110y of substrate 110 to the outside can be exposed by removing carrier 10 positioned on the flipped substrate 110. Conductive layer 111 and dielectric layer 112 of substrate 110 can be exposed to the outside. The removing of carrier 10 can be performed by a general grinding or chemical etching process. Alternatively, the removing of carrier 10 can also be performed by a releasing process using ultraviolet or laser. In addition, in a case where substrate 110 of this disclosure is a printed circuit board, the step of removing carrier 10 can be omitted.

Figure 2I:
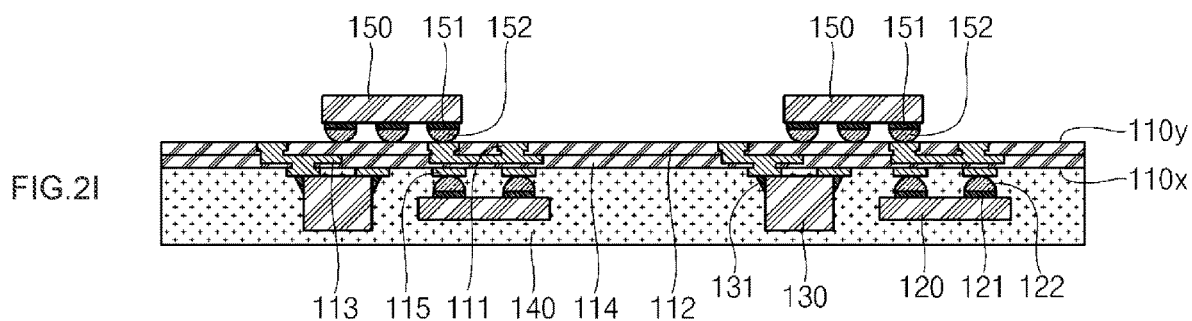

FIG. 2I shows a cross-sectional view of semiconductor device 100 at a later stage of manufacture. In the example shown in FIG. 2I, electronic device 150 can be electrically connected to conductive layer 111 exposed to top surface 110y of substrate 110.

In some examples, pick-and-place equipment (not shown) picks up electronic device 150 to be placed on conductive layer 111 of substrate 110. Next, electronic device 150 can be electrically connected to conductive layer 111 of substrate 110 using, for example, a mass reflow process, a thermal compression process, or a laser bonding process.

In some examples, electronic device 150 can be referred to as a semiconductor die or a semiconductor chip. In addition, in some examples, electronic device 150 can comprise at least one of a logic die, a micro control unit, a memory, a digital signal processor, a network processor, a power management unit, an audio processor, an RF circuit, a wireless baseband system on chip processor, an application specific integrated circuit, or an equivalent. In some examples, electronic device 150 can include an active region and a non-active region. In addition, in some examples, active region can be disposed to face substrate 110. In addition, in some examples, active region can include interconnects 151. In some examples, interconnects 151 can be referred to as die pads, bond pads, aluminum pads or conductive posts.

In addition, interconnects 151 can be connected to conductive layer 111 of substrate 110 using a low melting point material 152. In an example, low melting point material 152 can include one selected from the group consisting of Sn, Ag, Pb, Cu, Sn—Pb, Sn37-Pb, Sn95-Pb, Sn—Pb—Ag, Sn—Cu, Sn—Ag, Sn—Au, Sn—Bi, Sn—Ag—Cu, or equivalents. Interconnects 151 of electronic device 150 and conductive layer 111 of substrate 110 can be electrically connected to each other using low melting point material 152. Electronic device 150 can have an overall thickness in the range from approximately 50 µm to approximately 1000 µm.

Figure 2J:
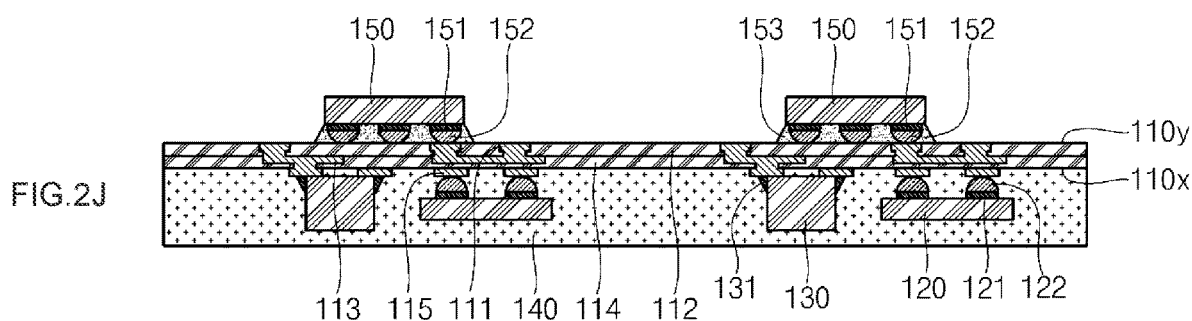

FIG. 2J shows a cross-sectional view of semiconductor device 100 at a later stage of manufacture. In the example shown in FIG. 2J, an underfill 153 can be filled between electronic device 150 and substrate 110.

In some examples, underfill 153 can be referred to as a dielectric layer or a non-conductive paste. In some examples, underfill 153 can be a resin without an inorganic filler. In some examples, after electronic device 150 is electrically connected to substrate 110, underfill 153 can be inserted into a gap between electronic device 150 and substrate 110 using a capillary underfill that can be cured after the injection. In some examples, underfill 153 can be first dispensed to cover conductive layer 111 disposed on substrate 110 and interconnects 151, and low melting point material 152 of electronic device 150 can then be electrically connected to conductive layer 111 passing through underfill 153. Underfill 153 can prevent electronic device 150 from being electrically isolated from substrate 110 due to physical or chemical impacts. In addition, underfill 153 can prevent electronic device 150 from being directly electrically connected to leadframe 160.

Figure 2K:
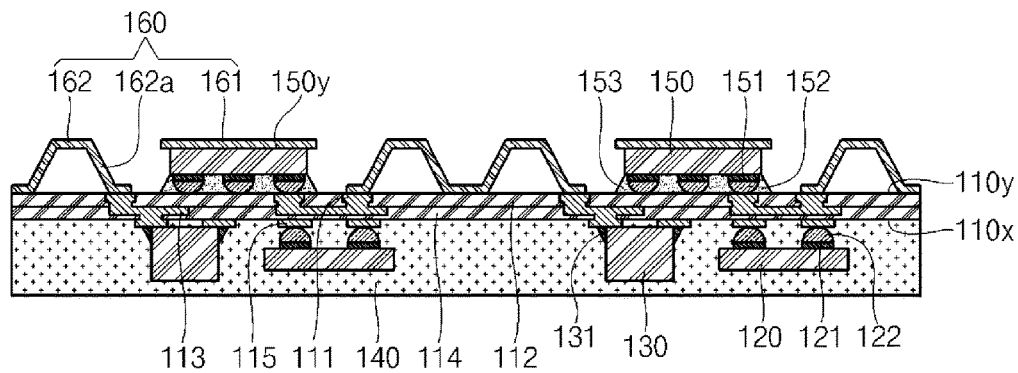

FIG. 2K, FIG. 3A, and FIG. 4 show semiconductor device 100 at a later stage of manufacture. In the examples shown in FIG. 2K, FIG. 3A, and FIG. 4, leadframe 160 can be mounted on substrate 110 to cover a top surface 150y of electronic device 150 and to be electrically connected to conductive layer 111 exposed to top surface 110y of substrate 110.

Leadframe 160 can include a paddle 161 covering top surface 150y of electronic device 150 and a plurality of leads 162 electrically connected to conductive layer 111 of substrate 110. Referring to FIG. 3A, leadframe 160 can include tie bars 163 outwardly extending from four corners of paddle 161, and dam bars 164 for connecting and fixing tie bars 163 and the plurality of leads 162 to each other. Dam bars 164 can be shaped of rectangular rings and can be outwardly spaced a predetermined distance apart from paddle 161.

Paddle 161 can be shaped of a rectangular plate and can have four sides and four corners. In some examples, paddle 161 can be referred to as a die pad or a heat sink. Paddle 161 can be adhered to electronic device 150 to entirely cover top surface 150y of electronic device 150. Paddle 161 can emit heat generated from electronic device 150 to the outside. In some examples, paddle 161 is thermally coupled with electronic device 150 to dissipate heat generated from the electronic device 150, although the scope of the disclosure is not limited in this respect.

The plurality of leads 162 can extend from four sides of each of dam bars 164 to paddle 161 so as to have a predetermined length. In some examples, the plurality of leads 162 can be referred to as lands or input/output pads. The plurality of leads 162 can be arranged on dam bars 164 so as to be spaced a predetermined distance apart from each other. The plurality of leads 162 can be positioned on the same plane with paddle 161. For example, leads 162 can be positioned to be coplanar or substantially coplanar with paddle 161. Each of the plurality of leads 162 can include lead racks 162a downwardly bent at lengthwise opposite sides.

Lead racks 162a provided at opposite sides of lead 162 can have the same length in the lengthwise direction of lead 162. Each of the plurality of leads 162 can be positioned at the center of lead racks 162a provided at opposite sides of lead 162.

In addition, lead racks 162a can be positioned lower than paddle 161 and lead 162. The lead racks 162a of each of the plurality of leads 162, can be electrically connected to conductive layer 111 of substrate 110. Lead rack 162a can be electrically connected to conductive layer 111 of substrate 110 using a conductive material. Leads 162 can be electrically connected to electronic device 120, passive device 130 or electronic device 150 through substrate 110. As shown in FIG. 3A, each of the plurality of leads 162 can have a width equal to the width of lead rack 162a.

Figure 5:
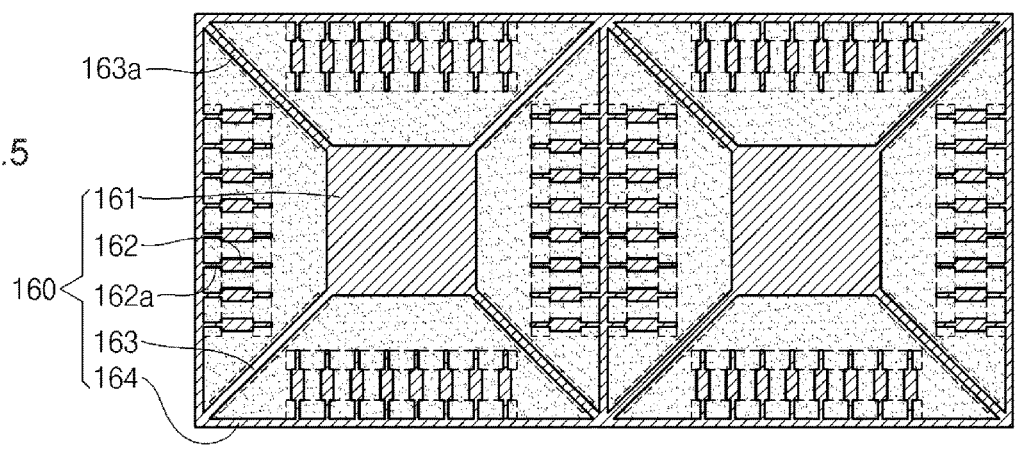
FIG. 5 shows a plan view of an example method for manufacturing an example semiconductor device including leads having a larger width than lead racks.

Alternatively, as shown in FIG. 5, lead 162 can have a width larger than the width of lead rack 162a.

Tie bars 163 can outwardly extend from four corners of paddle 161 so as to have a predetermined length and can be connected to dam bars 164. Tie bars 163 can connect four corners of paddle 161 to four corners of dam bars 164. Each of tie bars 163 can include downsets 163a downwardly bent from paddle 161. In some examples, downsets 163a can be provided throughout the entire length of each of tie bars 163, so that tie bars 163 are downwardly bent and tilted as a whole. Tie bars 163 can connect paddle 161 and dam bars 164 to each other and can be tilted at equal inclination angles.

Figure 6A:
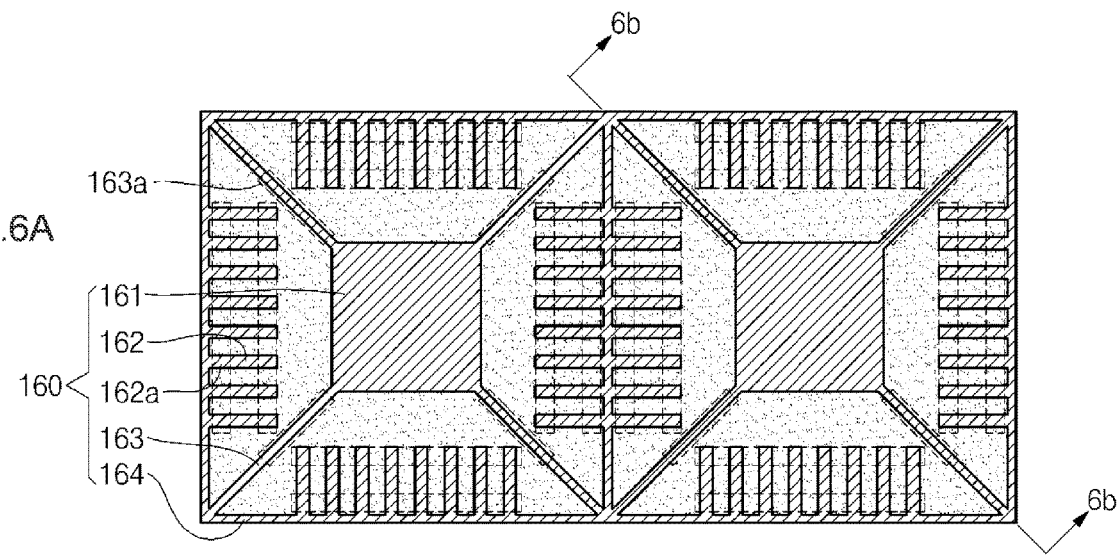
FIG. 6A shows a plan view of an example method for manufacturing the example semiconductor device shown in FIG. 2K.
Figure 6B:
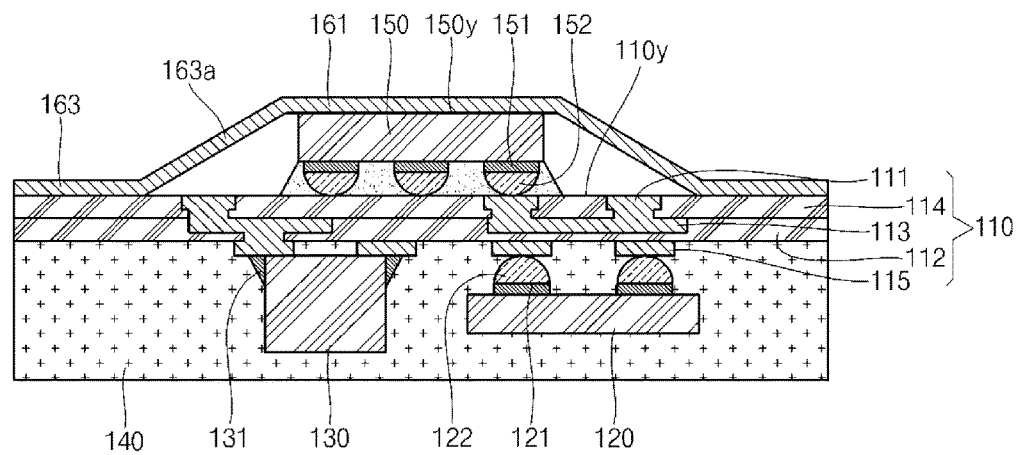
FIG. 6B shows a cross-sectional view of the example method for manufacturing the example semiconductor device taken along the line 6b-6b of FIG. 6A.

In some examples, as shown in FIGS. 6A and 6B, downsets 163a can be provided at only some regions of tie bars 163. Specifically, downsets 163a can be provided at some regions of tie bars 163, which are adjacent to four corners of paddle 161. For example, tie bars 163 can be downwardly bent from paddle 161 by downsets 163a and can be parallel with top surface 110y of substrate 110 by a predetermined length. Since tie bars 163 include downsets 163a, dam bars 164 positioned at exterior sides of downsets 163a can be positioned lower than paddle 161.

Tie bars 163 can be spaced apart from electronic device 150 and can be shaped to surround electronic device 150. Tie bars 163 can function to shield electromagnetic interference induced into electronic device 150.

Leadframe 160 can be formed using a material or materials selected from a copper (Cu) based material (Cu:Fe:P=99.8:0.01:0.025), a Cu alloy based material (Cu:Cr:Sn:Zn=99:0.25:0.25:0.22), and an alloy 42 based material (Fe:Ni=58:42). In addition, gold (Au), silver (Ag), tin (Sn), nickel (Ni), cadmium (Cd), or palladium (Pd) can be plated on part or whole of the surface of leadframe 160 for the purpose of preventing leadframe 160 from being corroded. Leadframe 160 can have an overall thickness in the range from approximately 0.050 mm to approximately 1.0 mm.

In addition, in order to more clearly define the shape of leadframe 160, downsets 163a and lead racks 162a, which are downwardly bent, are indicated by dotted lines in FIG. 3A and FIG. 6A.

Figure 2L:
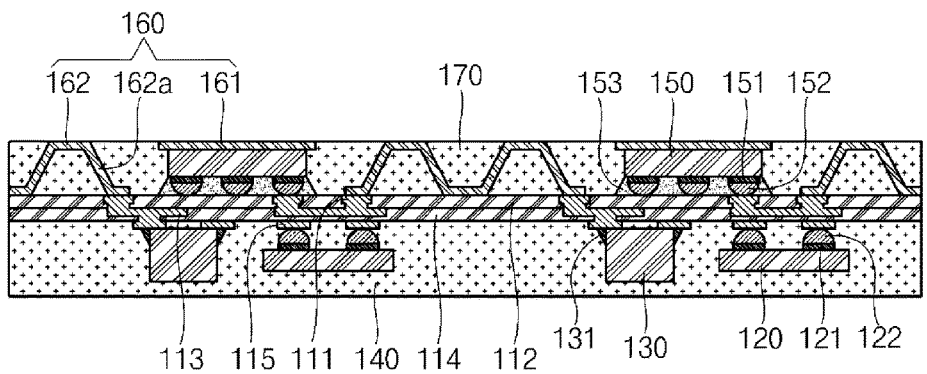

FIG. 2L and FIG. 3B show semiconductor device 100 at a later stage of manufacture. In the examples shown in FIGS. 2L and 3B, encapsulant 170 can be formed to cover the top surface 110y of substrate 110, electronic device 150 and leadframe 160. Paddle 161 and leads 162 of leadframe 160 can be exposed to an upper portion of encapsulant 170. The plurality of leads 162 exposed to the upper portion of encapsulant 170 can be arranged on the same line so as to be spaced apart from each other. In addition, tie bars 163, lead racks 162a, and dam bars 164 of leadframe 160 can be encapsulated by encapsulant 170.

In some examples, encapsulant 170 can be referred to as an epoxy molding compound, an epoxy molding resin or a sealant. In addition, in some examples, encapsulant 170 can be referred to as a molding part, a sealing part, an encapsulation part, a protection part, or a body. In some examples, encapsulant 170 can include, but not limited to, an organic resin, an inorganic filler, a curing agent, a catalyst, a colorant, a flame retardant, and so on. Molding based on encapsulant 170 can be formed by any of a variety of processes. In some examples, encapsulant 170 can be formed by, but not limited to, compression molding, transfer molding, liquid-phase encapsulant molding, vacuum lamination, paste printing or film assist molding. Encapsulant 170 can have a thickness in the range from approximately 0.1 mm to approximately 1.0 mm. Encapsulant 170 can encapsulate electronic device 150, thereby protecting electronic device 150 from external factors or circumstances.

Figure 2M:
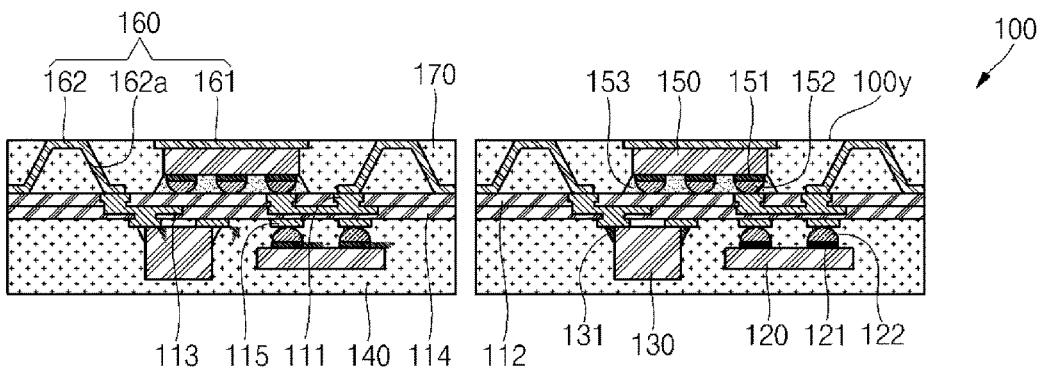

FIGS. 2M and 3C show semiconductor device 100 at a later stage of manufacture. In the examples shown in FIGS. 2M and 3C, encapsulant 170, substrate 110, leadframe 160 and encapsulant 140 can be sawed, thereby separating the resultant product into individual semiconductor devices 100. In some examples, the sawing process can be referred to as a singulation process.

For example, some regions of encapsulant 170, substrate 110, leadframe 160 and encapsulant 140 can be removed by a diamond wheel, laser beam or etching, thereby completing individual semiconductor devices 100. Each of completed individual semiconductor devices 100 can include substrate 110, electronic device 120, passive device 130, encapsulant 140, electronic device 150, leadframe 160 and encapsulant 170. In addition, in the singulation process, dam bars 164 connecting the plurality of leads 162 to tie bars 163 can be removed, thereby electrically disconnecting the plurality of leads 162 from paddle 161.

Although two semiconductor devices 100 are shown in FIGS. 2A to 2M and 3A to 3C, this is not a limitation of the present disclosure. In some examples, two or more semiconductor devices 100 arranged in a matrix can be manufactured by the process shown in FIGS. 2A to 2M and 3A to 3C.

Additionally, the completed semiconductor device 100 can be flipped, so that leads 162 can be positioned on a bottom surface 100y of semiconductor device 100. In some examples, leads 162 can be referred to as external input/output terminals of semiconductor device 100.

Figure 7:
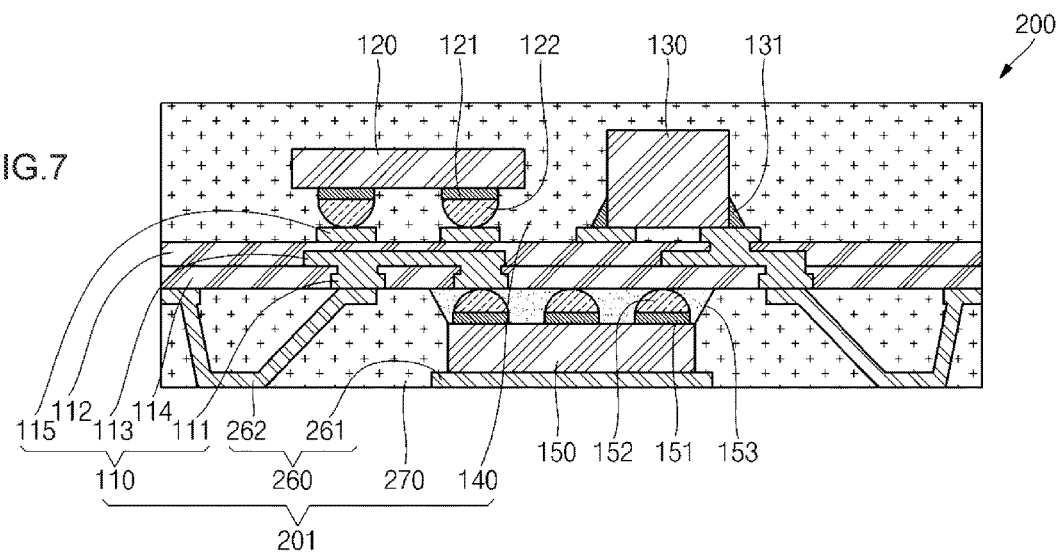
FIG. 7 shows a cross-sectional view of an example semiconductor device.

FIG. 7 shows a cross-sectional view of an example semiconductor device (200). In the example shown in FIG. 7, semiconductor device 200 can include a substrate 110, electronic devices 120 and 150, a passive device 130, a leadframe 260 and encapsulants 140 and 270.

Substrate 110 can include dielectric layers 112 and 114 and conductive layers 111, 113 and 115. Electronic devices 120 and 150 can include interconnects 121 and 151, respectively. Interconnects 121 and 151 of electronic devices 120 and 150 can be located on bottom or top surfaces of electronic devices 120 and 150. Interconnects 121 and 151 can be made of conductive materials and can be electrically connected to conductive layers 111 and 115 of substrate 110, respectively. Further, an underfill 153 can be interposed between the top surface of electronic device 150 and the bottom surface of substrate 110. Although semiconductor device 200 shown as including two electronic devices 120 and 150, this is not limitation of the present disclosure. In other examples, semiconductor device 200 can include a single electronic device or more than three electronic devices, whether on the top and/or bottom of substrate 110.

Passive device 130 can include a terminal 131. Terminal 131 of passive device 130 can be electrically connected to conductive layer 111 of substrate 110. Although semiconductor device 200 is shown as including a single passive device 130 on the top or substrate 110, this is not a limitation of the present disclosure. In other examples, semiconductor device 200 can include one or more passive devices, whether on the top and/or bottom of substrate 110.

Leadframe 260 can include a paddle 261 covering the bottom surface of electronic device 150 and a lead 262 electrically connected to conductive layer 111 of substrate 110. Paddle 261 and lead 262 of leadframe 260 can be exposed to the outside through a bottom surface of encapsulant 270. A plurality of leads 262 exposed to the outside through a bottom surface of encapsulant 270 can be arranged on two rows or two columns to be parallel with the outer periphery of encapsulant 270.

Encapsulant 140 can encapsulate electronic device 120 and passive device 130 positioned on the top surface of substrate 110. In addition, encapsulant 270 can encapsulate electronic device 150 and leadframe 260 positioned on the bottom surface of substrate 110.

Substrate 110, leadframe 260 and encapsulants 140 and 270 can be referred to as a semiconductor package 201 or a package 201. Semiconductor package 201 can protect electronic device 120 and passive device 130 from external elements and/or environmental exposure. In addition, semiconductor package 201 can provide electrical couplings between an external component (not shown) and electronic devices 120 and 150 and between an external component (not shown) and passive device 130.

FIGS. 8A to 8I show cross-sectional views of an example method for manufacturing semiconductor device 200. FIGS. 9A to 9C show plan views of the example method for manufacturing semiconductor device 200 shown in FIGS. 8G to 8I.

Figure 8A:
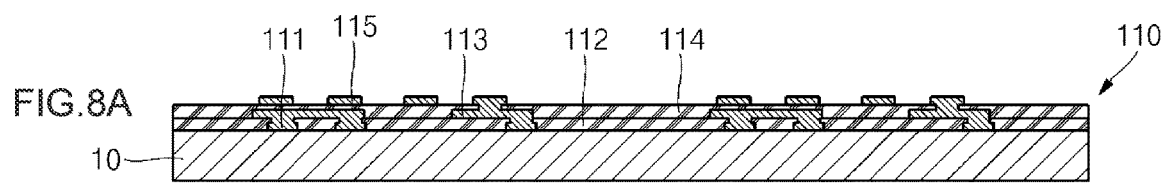
FIG. 8A to FIG. 8I show cross-sectional views of an example method for manufacturing an example semiconductor device.
Figure 9A:
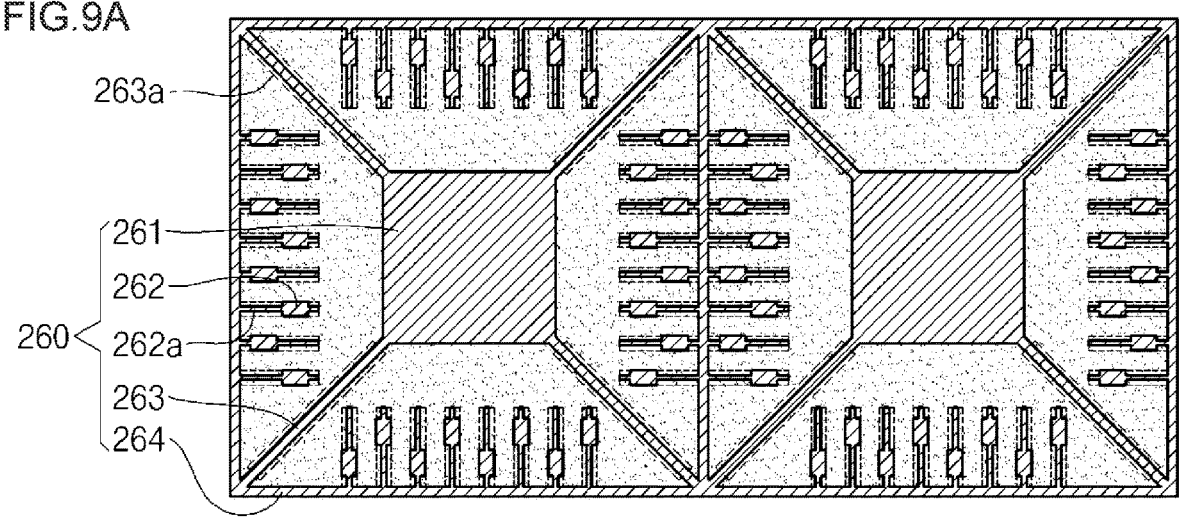
FIG. 9A to FIG. 9C show plan views of the example method for manufacturing the example semiconductor device shown in FIG. 8G to FIG. 8I.
Figure 9B:
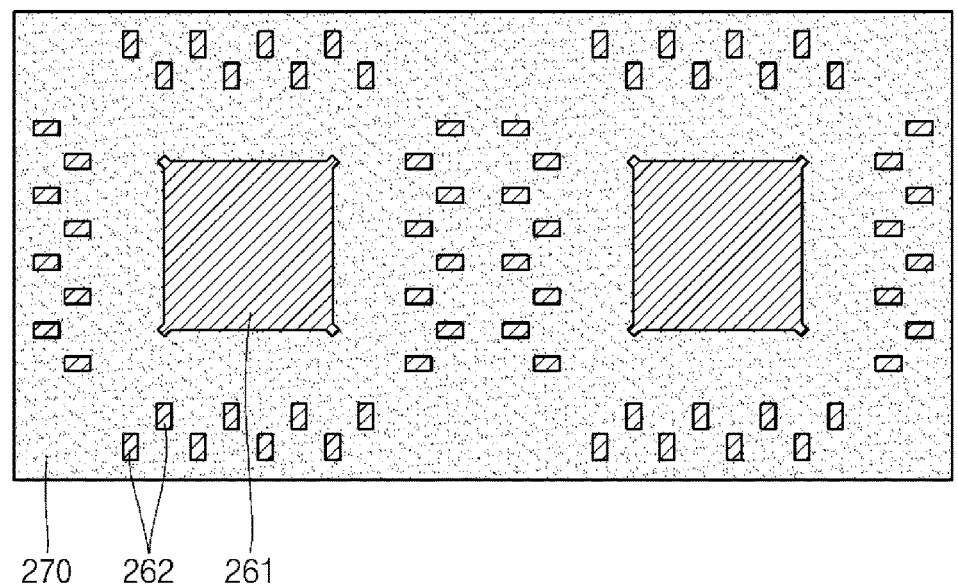
Figure 9C:
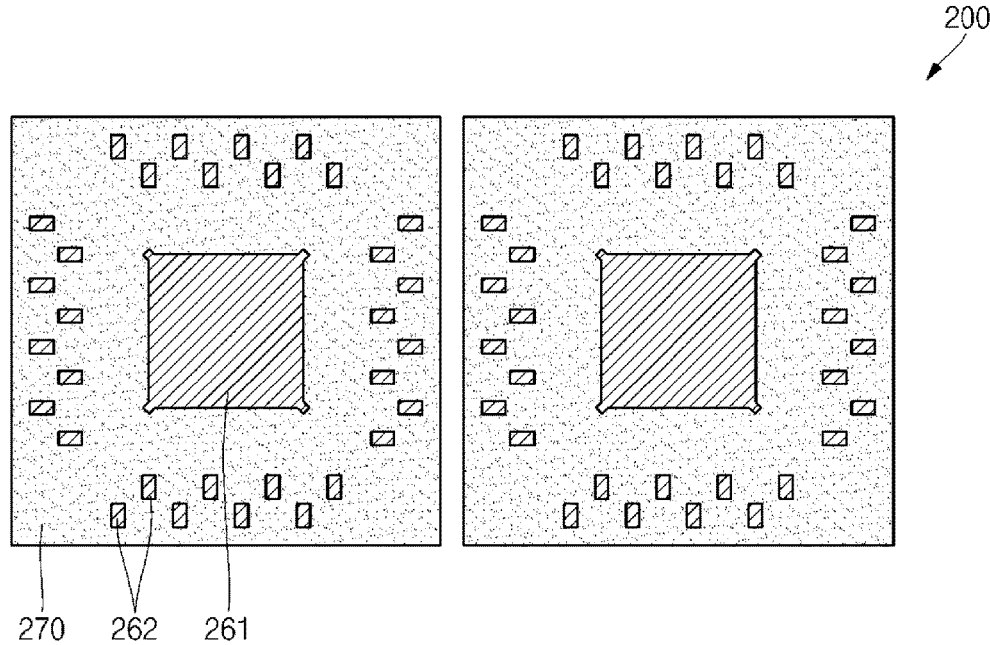

FIG. 8A shows a cross-sectional view of semiconductor device 200 at an initial stage of manufacture. Substrate 110 shown in FIG. 8A can be formed by the same process with the process of forming substrate 110 shown in FIGS. 2A to 2E.

Figure 8B:
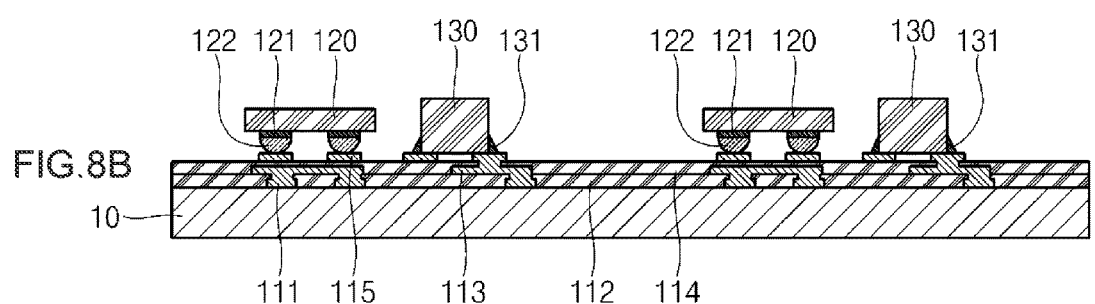

FIG. 8B shows a cross-sectional view of semiconductor device 200 at a later stage of manufacture. The process of connecting electronic device 120 and passive device 130 to conductive layer 113 of substrate 110 shown in FIG. 8B can be the same with the process shown in FIG. 2F.

Figure 8C:
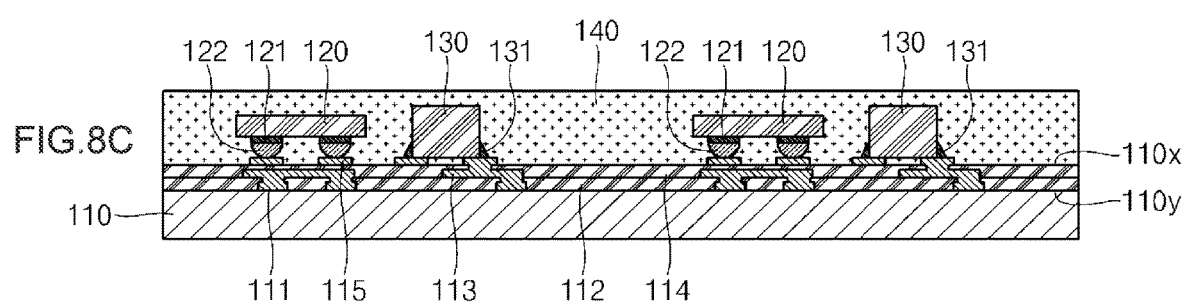

FIG. 8C shows a cross-sectional view of semiconductor device 200 at a later stage of manufacture. The process of forming encapsulant 140 to entirely encapsulate top surface 110x of substrate 110, electronic device 120 and passive device 130 shown in FIG. 8C can be the same with the process shown in FIG. 2G.

Figure 8D:
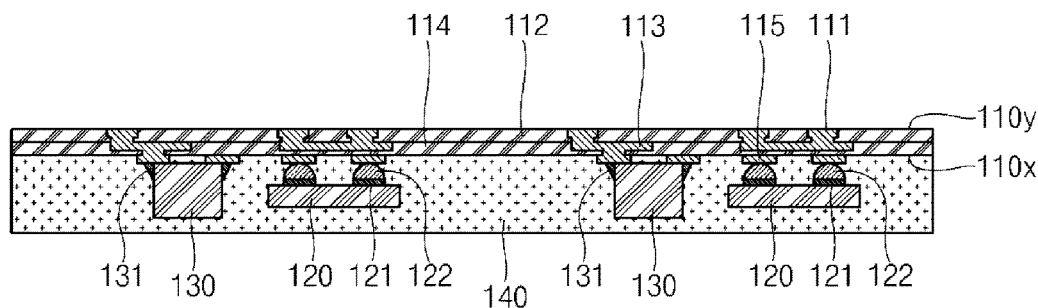

FIG. 8D shows a cross-sectional view of semiconductor device 200 at a later stage of manufacture. In the example shown in FIG. 8D, the process of flipping semiconductor device 200 and then removing carrier 10 can be the same with the process shown in FIG. 2H. In addition, in a case where substrate 110 of this disclosure is a printed circuit board, the step of removing carrier 10 can be omitted.

Figure 8E:
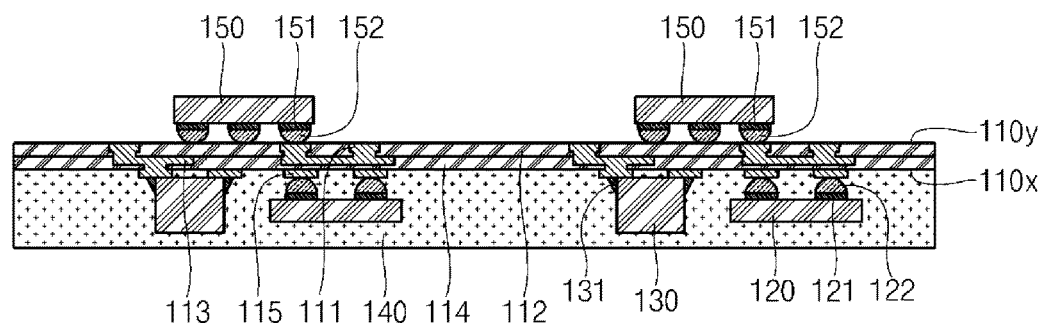

FIG. 8E shows a cross-sectional view of semiconductor device 200 at a later stage of manufacture. In the example shown in FIG. 8E, the process of connecting electronic device 150 to conductive layer 111 exposed to top surface 110y of substrate 110 can be the same with the process shown in FIG. 2I.

Figure 8F:
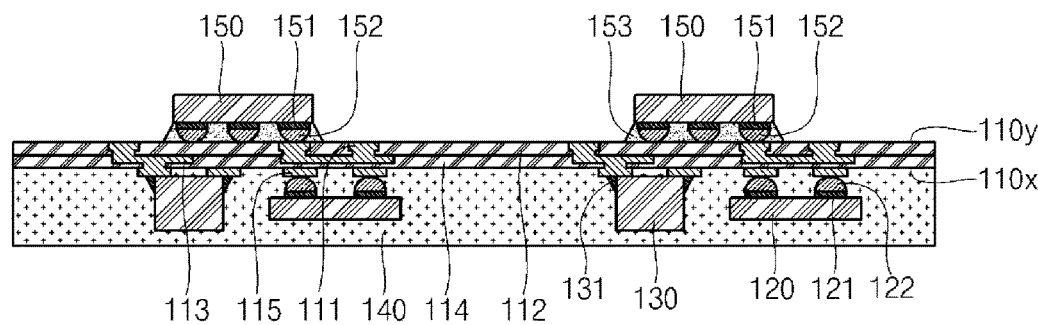

FIG. 8F shows a cross-sectional view of semiconductor device 200 at a later stage of manufacture. In the example shown in FIG. 8F, the process of filling underfill 153 between electronic device 150 and substrate 110 can be the same with the process shown in FIG. 2J.

Figure 8G:
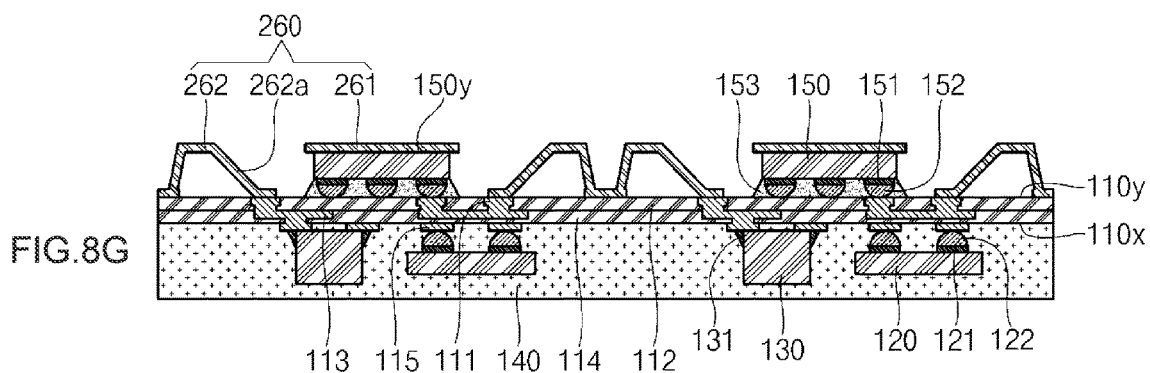

FIGS. 8G and 9A show semiconductor device 200 at a later stage of manufacture. In the examples shown in FIGS. 8G and 9A, leadframe 260 can be mounted on substrate 110 to cover top surface 150y of electronic device 150 and to be electrically connected to conductive layer 111 exposed to top surface 110y of substrate 110.

Leadframe 260 can include a paddle 261 covering top surface 150y of electronic device 150 and a plurality of leads 262 electrically connected to conductive layer 111 of substrate 110. Referring to FIG. 9A, leadframe 260 can include tie bars 263 outwardly extending from four corners of paddle 261, and dam bars 264 for connecting and fixing tie bars 263 and the plurality of leads 262 to each other. Dam bars 264 can be shape of rectangular rings and can be outwardly spaced a predetermined distance apart from paddle 261.

Paddle 261 can be shape of a rectangular plate and can have four sides and four corners. In some examples, paddle 261 can be referred to as a die pad or a heat sink. Paddle 261 can be adhered to electronic device 150 to entirely cover top surface 150y of electronic device 150. Paddle 261 can emit heat generated from electronic device 150 to the outside. In some examples, paddle 261 is thermally coupled with electronic device 150 to dissipate heat generated from the electronic device 150, although the scope of the disclosure is not limited in this respect.

The plurality of leads 262 can extend from four sides of each of dam bars 264 to paddle 261 so as to have a predetermined length. In some examples, the plurality of leads 262 can be referred to as lands or input/output pads. The plurality of leads 262 can be arranged on dam bars 264 so as to be spaced a predetermined distance apart from each other. The plurality of leads 262 can be positioned on the same plane with paddle 261. For example, leads 262 can be positioned to be coplanar with and paddle 261. Each of the plurality of leads 262 can include lead racks 262a downwardly bent at lengthwise opposite sides.

Lead racks 262a provided at opposite sides of lead 262 can have different lengths in the lengthwise direction of lead 262. Each of the plurality of leads 262 can be positioned at the center of lead racks 262a provided at opposite sides of lead 262.

In each of the plurality of leads 262, the lead rack 262a extending from lead 262 to paddle 261 can be shorter than or longer than lead rack 262a connecting dam bar 264 to lead 262. Preferably, the plurality of leads 262 can be arranged in two rows or two columns parallel with dam bars 264 so as to be spaced apart from each other. The plurality of leads 262 can be alternately arranged to be positioned on different rows or columns from the leads 262 adjacent to it.

In addition, lead racks 262a can be positioned lower than paddle 261. Lead rack 262a of each of the plurality of leads 262 can be electrically connected to conductive layer 111 of substrate 110. Lead rack 262a can be electrically connected to conductive layer 111 of substrate 110 using a conductive material. Leads 262 can be electrically connected to electronic device 120, passive device 130 or electronic device 150 through substrate 110. Each of the plurality of leads 262 can have a width larger than that of lead rack 262a. Additionally, lead 262 and lead rack 262a can have equal widths, like in leadframe 160 shown in FIG. 3A.

Tie bars 263 can outwardly extend from four corners of paddle 261 so as to have a predetermined length and can be connected to dam bars 264. Tie bars 263 can connect four corners of paddle 261 to four corners of dam bars 264. Each of tie bars 263 can include downsets 263a downwardly bent from paddle 261. In some examples, downsets 263a can be provided throughout the entire length of each of tie bars 263, so that the tie bars 263 are downwardly bent and tilted as a whole. Tie bars 263 can connect paddle 261 and dam bars 264 to each other and can be tilted at equal inclination angles.

In some examples, like the leadframe 160 shown in FIGS. 6A and 6B, downsets 263a can be provided on only some regions of tie bars 263. Specifically, downsets 263a can be provided at some regions of tie bars 263, which are adjacent to four corners of paddle 261. For example, tie bars 263 can be downwardly bent from paddle 261 by downsets 263a and can be parallel with top surface 110y of substrate 110 by a predetermined length. Since tie bars 263 include downsets 263a, dam bars 264 positioned at exterior sides of downsets 263a can be positioned lower than paddle 261.

Tie bars 263 can be spaced apart from electronic device 150 and can be shaped to surround electronic device 150. Tie bars 263 can function to shield electromagnetic interference induced into electronic device 150.

Leadframe 260 can be formed using one selected from a copper (Cu) based material (Cu:Fe:P=99.8:0.01:0.025), a Cu alloy based material (Cu:Cr:Sn:Zn=99:0.25:0.25:0.22), and an alloy 42 based material (Fe:Ni=58:42). In addition, gold (Au), silver (Ag), tin (Sn), nickel (Ni), cadmium (Cd) or palladium (Pd) can be plated on part or whole of the surface of leadframe 260 for the purpose of preventing leadframe 260 from being corroded. Leadframe 260 can have an overall thickness in the range from approximately 0.050 mm to approximately 1.0 mm.

In addition, in order to more clearly define the shape of leadframe 260, downsets 263a and lead racks 262a, which are downwardly bent, are indicated by dotted lines in FIG. 9A.

Figure 8H:
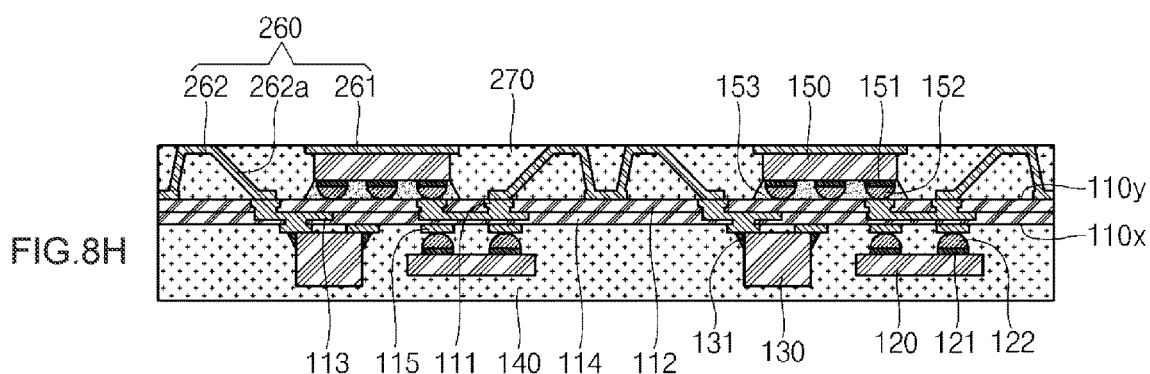

FIGS. 8H and 9B show semiconductor device 200 at a later stage of manufacture. In the examples shown in FIGS. 8H and 9B, encapsulant 270 can be formed to encapsulate the top surface 110y of substrate 110, electronic device 150 and leadframe 260. Paddle 261 and leads 262 of leadframe 260 can be exposed to an upper portion of encapsulant 270. The plurality of leads 262 exposed to the upper portion of encapsulant 270 exposed to the upper portion of encapsulant 270 can be arranged on two rows or two columns so as to be parallel with the outer periphery of encapsulant 270. In addition, the tie bars 263, lead racks 262a, and dam bars 264 of leadframe 260 can be encapsulated by encapsulant 270.

In some examples, encapsulant 270 can be referred to as an epoxy molding compound, an epoxy molding resin or a sealant. In addition, in some examples, encapsulant 270 can be referred to as a molding part, a sealing part, an encapsulation part, a protection part, or a body. In some examples, encapsulant 270 can comprise, but not limited to, an organic resin, an inorganic filler, a curing agent, a catalyst, a colorant, a flame retardant, and so on. Molding based on encapsulant 270 can be formed by any of a variety of processes. In some examples, encapsulant 270 can be formed by, but not limited to, compression molding, transfer molding, liquid-phase encapsulant molding, vacuum lamination, paste printing or film assist molding. Encapsulant 270 can have a thickness in the range from approximately 0.1 mm to approximately 1.0 mm. Encapsulant 270 can encapsulate electronic device 150, thereby protecting electronic device 150 from external factors or circumferences.

Figure 8I:
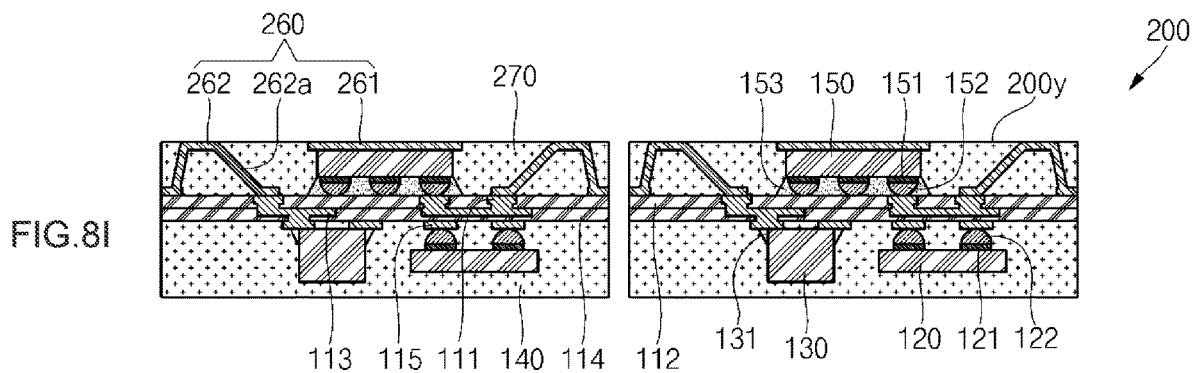

FIGS. 8I and 9C show semiconductor device 200 at a later stage of manufacture. In the examples shown in FIGS. 8I and 9C, encapsulant 270, substrate 110, leadframe 260 and encapsulant 140 can be sawed, thereby separating the resultant product into individual semiconductor devices 200. In some examples, the sawing process can be referred to as a singulation process.

For example, some regions of encapsulant 270, substrate 110, leadframe 260 and encapsulant 140 can be removed by a diamond wheel, laser beam or etching, thereby completing individual semiconductor devices 200. Each of completed individual semiconductor devices 200 can include substrate 110, electronic device 120, passive device 130, encapsulant 140, electronic device 150, leadframe 260 and encapsulant 270. In addition, in the singulation process, dam bars 264 connecting the plurality of leads 262 to tie bars 263 can be removed, thereby electrically disconnecting the plurality of leads 262 from paddle 261.

Although two semiconductor devices 200 are shown in FIGS. 8A to 8I and 9A to 9C, this is not a limitation of the present disclosure. In some examples, two or more semiconductor devices 200 arranged in a matrix type can be manufactured by the process shown in FIGS. 8A to 8I and 9A to 9C.

Additionally, the completed semiconductor device 200 can be flipped, so that leads 262 can be positioned on a bottom surface 200y of semiconductor device 200. In some examples, leads 262 can be referred to as external input/output terminals of semiconductor device 200.

Figure 10:
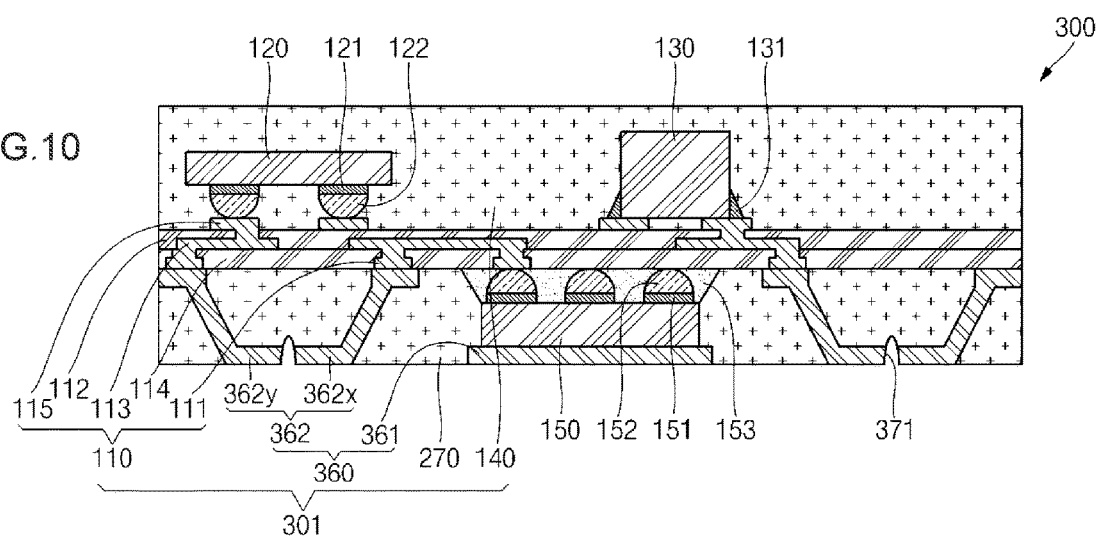
FIG. 10 shows a cross-sectional view of an example semiconductor device.

FIG. 10 shows a cross-sectional view of an example semiconductor device (300). In the example shown in FIG. 10, semiconductor device 300 can include a substrate 110, electronic devices 120 and 150, a passive device 130, a leadframe 360 and encapsulants 140 and 370.

Substrate 110 can include dielectric layers 112 and 114 and conductive layers 111, 113 and 115. Electronic devices 120 and 150 can include interconnects 121 and 151, respectively. Interconnects 121 and 151 of electronic devices 120 and 150 can be located on bottom surfaces or top surfaces of electronic devices 120 and 150. Interconnects 121 and 151 can be made of conductive materials and can be electrically connected to conductive layers 111 and 115 of substrate 110, respectively. Further, an underfill 153 can be interposed between the top surface of electronic device 150 and the bottom surface of substrate 110. Although semiconductor device 300 is shown as including two electronic devices 120 and, this is not a limitation of the present disclosure. In other examples, semiconductor device 300 can include a single electronic device or more than three electronic devices, whether on the top and/or bottom of substrate 110.

Passive device 130 can include a terminal 131. Terminal 131 of passive device 130 can be electrically connected to conductive layer 111 of substrate 110. Although semiconductor device 300 is shown as including a single passive device 130 on the top of substrate 110, this is not a limitation of the present disclosure. In other examples, semiconductor device 300 can include a one or more passive devices whether on the top and/or bottom of substrate 110.

Leadframe 360 can include a paddle 361 covering a bottom surface of electronic device 150 and a plurality of leads 362x and 362y electrically connected to conductive layer 115 of substrate 110. Paddle 361 and leads 362x and 362y of leadframe 360 can be exposed to the outside through a bottom surface of encapsulant 370. A concave groove 371 can be provided between two neighboring leads 362x and 362y.

Encapsulant 140 can encapsulate electronic device 120 and passive device 130 positioned on the top surface of substrate 110. In addition, encapsulant 370 can encapsulate electronic device 150 and leadframe 360 positioned on the bottom surface of substrate 110.

Substrate 110, leadframe 360 and encapsulants 140 and 370 can be referred to as a semiconductor package 301 or a package 301. Semiconductor package 301 can protect electronic devices 120 and 150 and passive device 130 from external elements and/or environmental exposure. In addition, semiconductor package 301 can provide electrical couplings between an external component (not shown) and electronic devices 120 and 150 and between an external component (not shown) and passive device 130.

FIGS. 11A to 11J show cross-sectional views of an example method for manufacturing semiconductor device 300. FIGS. 12A to 12D show plan views of the example method for manufacturing semiconductor device 300 shown in FIGS. 11A to 11J.

Figure 11A:
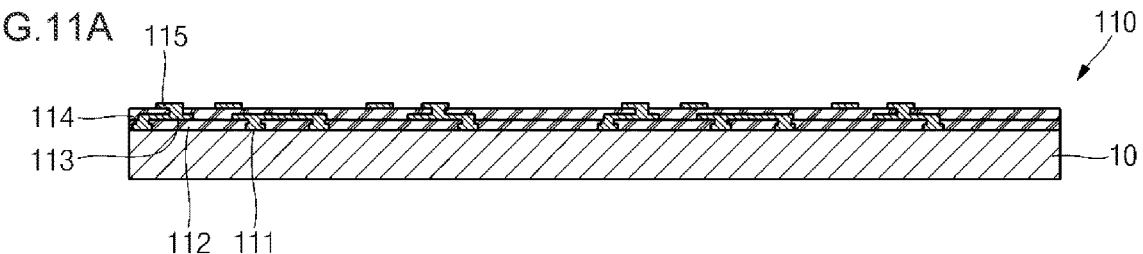
FIG. 11A to FIG. 11J show cross-sectional views of an example method for manufacturing the example semiconductor device shown in FIG. 10.

FIG. 11A shows a cross-sectional view of semiconductor device 300 at an initial stage of manufacture. Substrate 110 shown in FIG. 11A can be formed by the same process with the process of forming substrate 110 shown in FIGS. 2A to 2E.

Figure 11B:
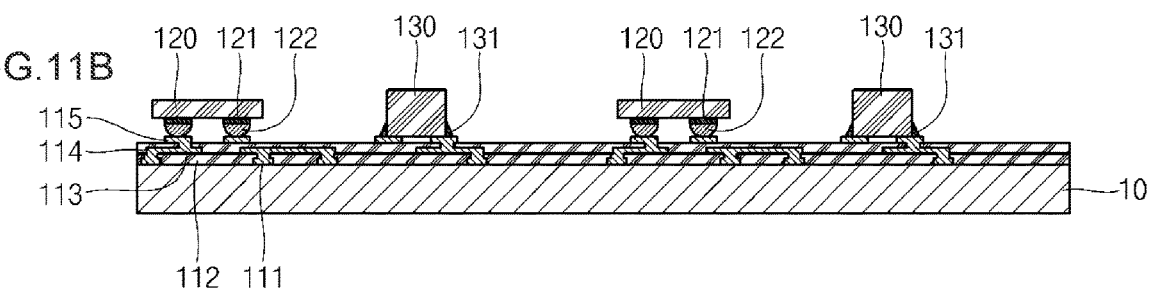

FIG. 11B shows a cross-sectional view of semiconductor device 300 at a later stage of manufacture. The process of connecting electronic device 120 and passive device 130 to conductive layer 113 of substrate 110 shown in FIG. 8B can be the same with the process shown in FIG. 2F.

Figure 11C:
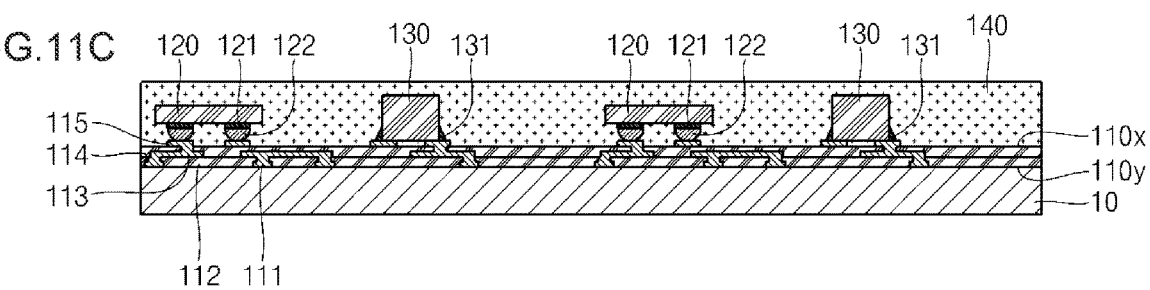

FIG. 11C shows a cross-sectional view of semiconductor device 300 at a later stage of manufacture. The process of forming encapsulant 140 to entirely encapsulate the top surface 110x of substrate 110, electronic device 120 and passive device 130 shown in FIG. 11C can be the same with the process shown in FIG. 2G.

Figure 11D:
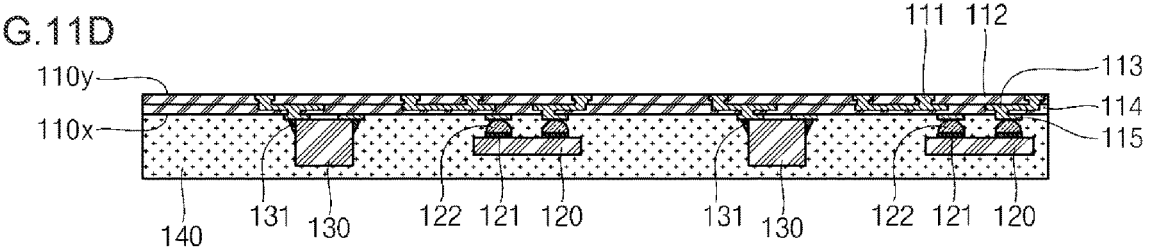

FIG. 11D shows a cross-sectional view of semiconductor device 300 at a later stage of manufacture. In the example shown in FIG. 11D, the process of flipping semiconductor device 300 and then removing carrier 10 can be the same with the process shown in FIG. 2H. In addition, in a case where substrate 110 of this disclosure is a printed circuit board, the step of removing carrier 10 can be omitted.

Figure 11E:
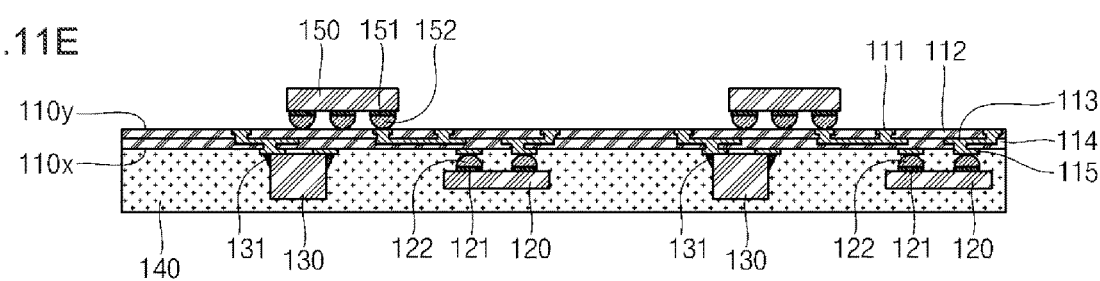

FIG. 11E shows a cross-sectional view of semiconductor device 300 at a later stage of manufacture. In the example shown in FIG. 11E, the process of connecting electronic device 150 to conductive layer 111 exposed to top surface 110y of substrate 110 can be the same with the process shown in FIG. 2I.

Figure 11F:
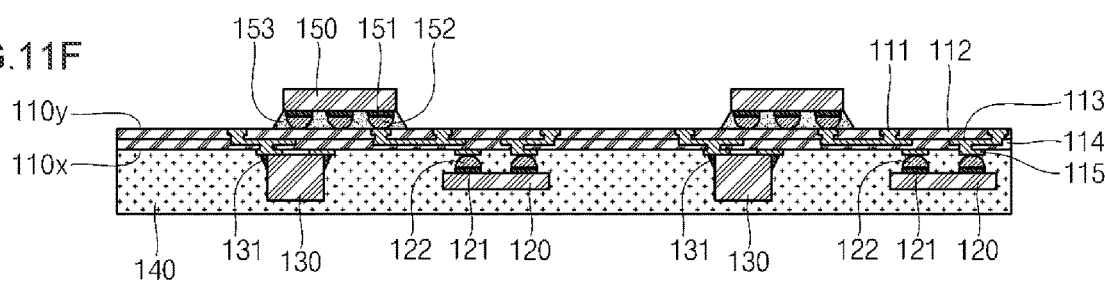

FIG. 11F shows a cross-sectional view of semiconductor device 300 at a later stage of manufacture. In the example shown in FIG. 11F, the process of filling underfill 153 between electronic device 150 and substrate 110 can be the same with the process shown in FIG. 2J.

Figure 11G:
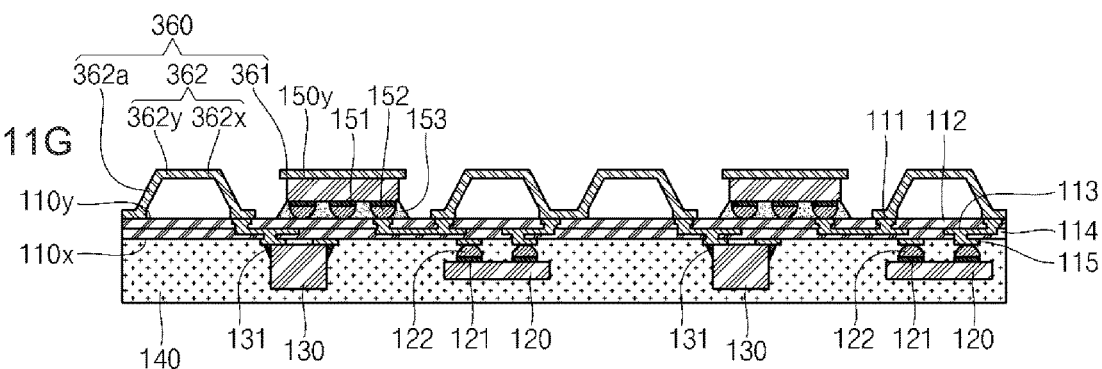
Figure 12A:
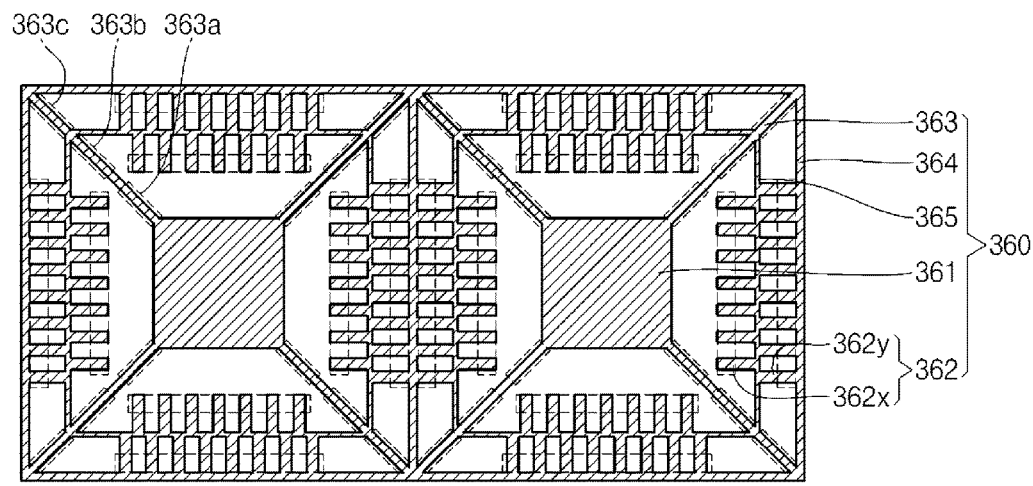
FIG. 12A to FIG. 12D show plan views of the example method for manufacturing the example semiconductor device shown in FIG. 11G to FIG. 11J.

FIGS. 11G and 12A show semiconductor device 300 at a later stage of manufacture. In the examples shown in FIGS. 11G and 12A, leadframe 360 can be mounted on substrate 110 to cover a top surface 150y of electronic device 150 and to be electrically to conductive layer 111 exposed to top surface 110y of substrate 110.

Leadframe 360 can include a paddle 161 covering the top surface 150y of electronic device 150, and a plurality of leads 362 electrically connected to conductive layer 111 of substrate 110. Referring to FIG. 12A, leadframe 360 can include tie bars 363 outwardly extending from four corners of paddle 361, dam bars 364 for connecting and fixing tie bars 363 and the plurality of leads 362 to each other, and connection rings 365 for connecting and fixing the plurality of leads 362 to each other. Connection rings 365 can be shaped of rectangular rings and can be outwardly spaced a predetermined distance apart from paddle 361. Dam bars 364 can be shaped of rectangular rings and can be outwardly spaced a predetermined distance apart from connection rings 365. Connection rings 365 can be positioned between paddle 361 and dam bars 364.

Paddle 361 can be shaped of a rectangular plate and can have four sides and four corners. In some examples, paddle 361 can be referred to as a die pad or a heat sink. Paddle 361 can be adhered to electronic device 150 to entirely cover top surface 150y of electronic device 150. Paddle 361 can emit heat generated from electronic device 150 to the outside.

In each of the plurality of leads 362 can include a plurality of leads 362x extending from four sides of each of connection rings 365 to paddle 361 so as to have a predetermined length and a plurality of leads 362y extending from four sides of each of connection rings 365 to dam bars 364 so as to have a predetermined length. In addition, the plurality of leads 362x and the plurality of leads 362y positioned at opposite sides of each of connection rings 365 can be arranged so as not to overlap each other in their lengthwise directions. In addition, the plurality of leads 362x and the plurality of leads 362y can be alternately arranged in view of connection rings 365. In addition, the plurality of leads 362y can extend from connection rings 365 to dam bars 364.

In some examples, the plurality of leads 362x and the plurality of leads 362y can be referred to as lands or input/output pads. The plurality of leads 362x and the plurality of leads 362y can be positioned on the same plane with paddle 361 and connection rings 365. For example, the plurality of leads 362x and the plurality of leads 362y, paddle 361 and connection rings 365 can be positioned at the same height.

The plurality of leads 362x can include lead racks 362a downwardly bent at sides of paddle 361. In addition, the plurality of leads 362y can include lead racks 362a downwardly bent at sides of dam bars 364. For example, lead racks 362a can be positioned lower than paddle 361, leads 362 and connection rings 365. Lead racks 362a of the plurality of leads 362x and the plurality of leads 362y can be electrically connected to conductive layer 111 of substrate 110. Lead racks 362a can be electrically connected to conductive layer 111 of substrate 110 using a conductive material. The plurality of leads 362x and the plurality of leads 362y can be electrically connected to electronic device 120, passive device 130 or electronic device 150 through substrate 110.

Tie bars 363 can outwardly extend from four corners of paddle 361 so as to have a predetermined length and can be connected to dam bars 364. Tie bars 363 can connect four corners of paddle 361, for corners of each of connection rings 365 and for corners of each of dam bars 364 to one another. Each of tie bars 363 can include downsets 363a downwardly bent from paddle 361.

In some examples, downsets 363a can be provided at tie bars 363 connecting paddle 361 to connection rings 365. In addition, since paddle 361 and connection rings 365 are positioned at the same height, tie bars 363 connecting paddle 361 to connection rings 365 can include downsets 363a downwardly bent from paddle 361 and downsets 363b downwardly bent from connection rings 365.

In addition, tie bars 363 can include downsets 363c provided at regions where connection rings 365 positioned at the same height with paddle 361 are connected to dam bars 364 positioned lower than paddle 361.

Tie bars 363 can be spaced apart from electronic device 150 by downsets 363a and can be shaped to surround electronic device 150. Tie bars 363 can function to shield electromagnetic interference induced into electronic device 150.

Leadframe 360 can be formed using one selected from a copper (Cu) based material (Cu:Fe:P=99.8:0.01:0.025), a Cu alloy based material (Cu:Cr:Sn:Zn=99:0.25:0.25:0.22), and an alloy 42 based material (Fe:Ni=58:42). In addition, gold (Au), silver (Ag), tin (Sn), nickel (Ni), cadmium (Cd) or palladium (Pd) can be plated on part or whole of the surface of leadframe 360 for the purpose of preventing leadframe 360 from being corroded. Leadframe 360 can have an overall thickness in the range from approximately 0.050 mm to approximately 1.0 mm.

In addition, in order to more clearly define the shape of leadframe 360, downsets 363a, 363b and 363c and lead racks 362a, which are downwardly or upwardly bent, are indicated by dotted lines in FIG. 12A.

Figure 11H:
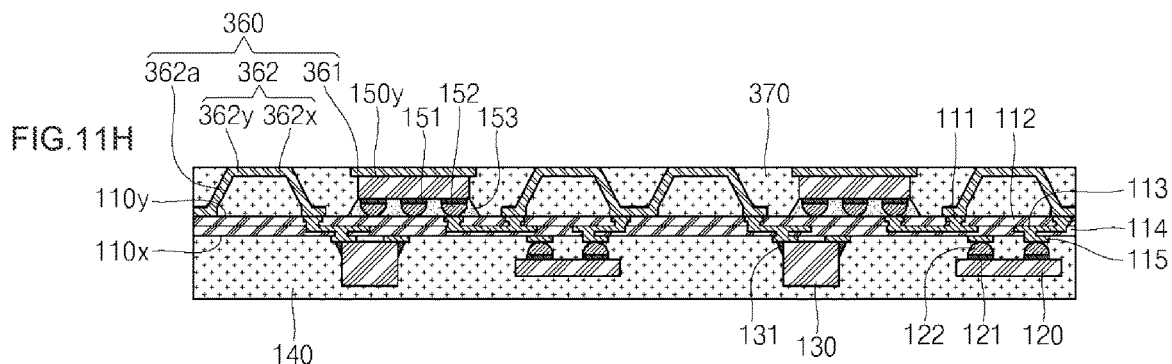
Figure 12B:
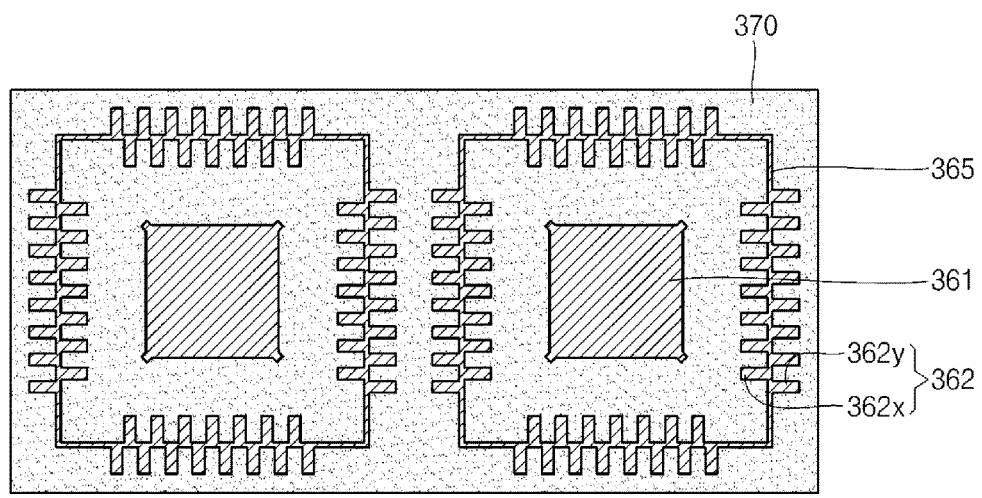

FIGS. 11H and 12B show semiconductor device 300 at a later stage of manufacture. In the examples shown in FIGS. 11H and 12B, encapsulant 370 can be formed to entirely encapsulate top surface 110y of substrate 110, electronic device 150 and leadframe 360. Paddle 361, leads 362 and connection rings 365 of leadframe 360 can be exposed to an upper portion of encapsulant 370. In addition, tie bars 363, lead lacks 362a, and dam bars 364 of leadframe 360 can be encapsulated by encapsulant 370.

In some examples, encapsulant 370 can be referred to as an epoxy molding compound, an epoxy molding resin or a sealant. In addition, in some examples, encapsulant 370 can be referred to as a molding part, a sealing part, an encapsulation part, a protection part, or a body. In some examples, encapsulant 370 can include, but not limited to, an organic resin, an inorganic filler, a curing agent, a catalyst, a colorant, a flame retardant, and so on. Molding based on encapsulant 370 can be formed by any of a variety of processes. In some examples, encapsulant 370 can be formed by, but not limited to, compression molding, transfer molding, liquid-phase encapsulant molding, vacuum lamination, paste printing or film assist molding. Encapsulant 370 can have a thickness in the range from approximately 0.15 mm to approximately 1.5 mm. Encapsulant 370 can encapsulate electronic device 150, thereby protecting electronic device 150 from external factors or circumferences.

Figure 11I:
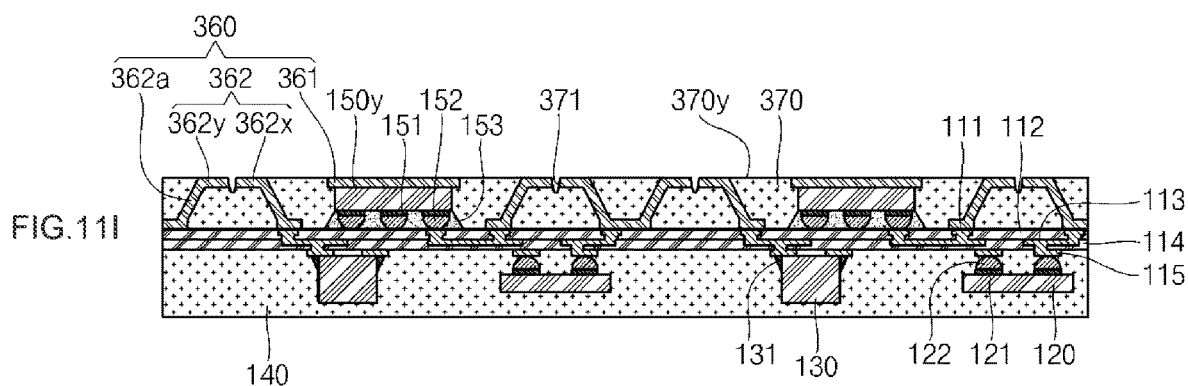
Figure 12C:
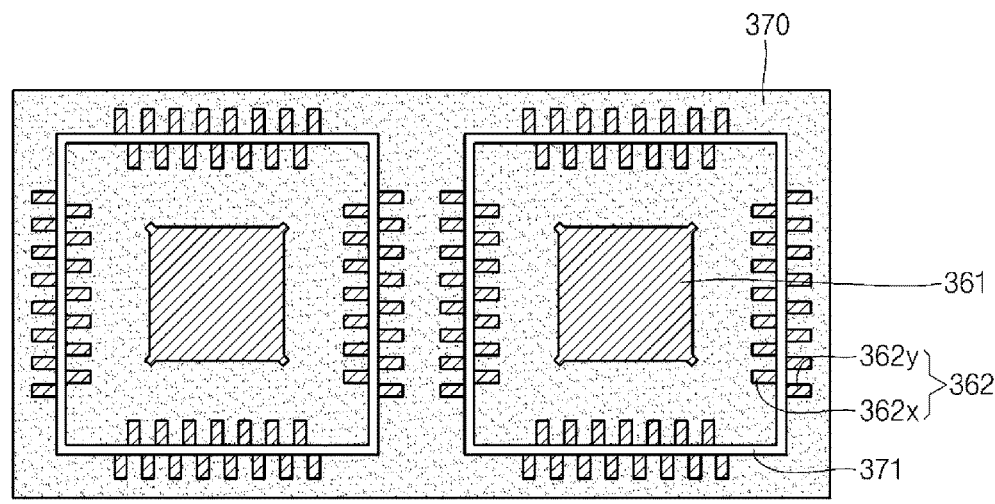

FIGS. 11I and 12C show semiconductor device 300 at a later stage of manufacture. In the examples shown in FIGS. 11I and 12C, connection rings 365 exposed to a top surface 370y of encapsulant 370 can be removed.

In some examples, connection rings 365 exposed to the top surface 370y of encapsulant 370 can be sawed to be removed, thereby forming a concave groove 371 having a predetermined depth on top surface 370y of encapsulant 370. As the result of removing connection rings 365, the plurality of leads 362x and 362y can be electrically independent from one another. In some examples, connection rings 365 can be removed by a diamond wheel or laser beam.

Figure 11J:
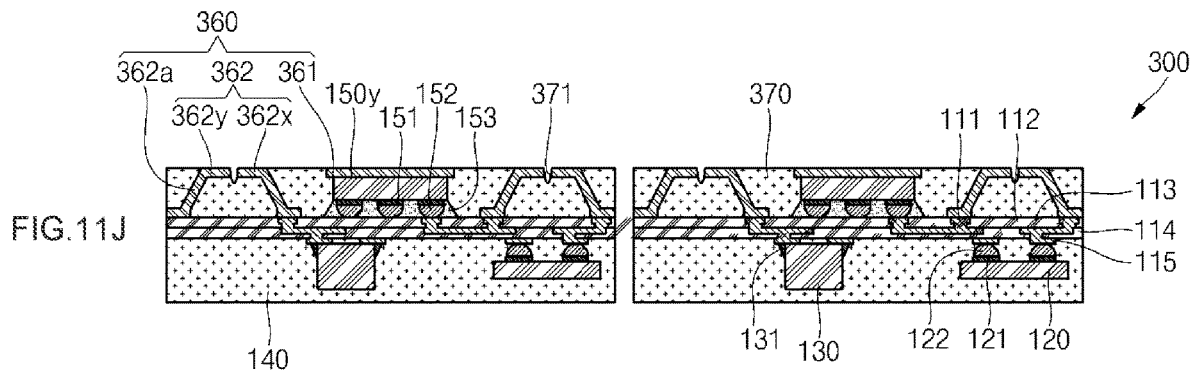
Figure 12D:
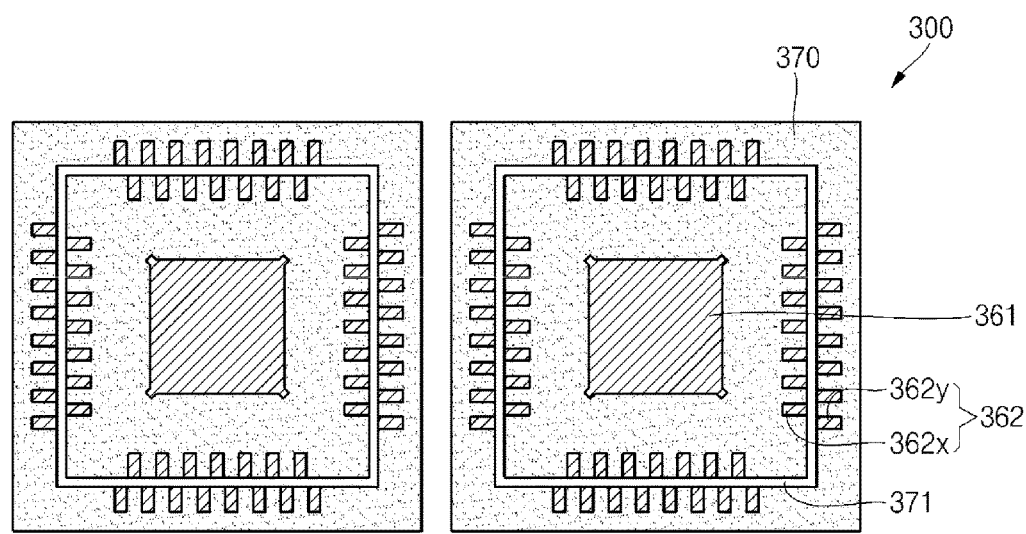

FIGS. 11J and 12D show semiconductor device 300 at a later stage of manufacture. In the examples shown in FIGS. 11J and 12D, encapsulant 370, substrate 110, leadframe 360 and encapsulant 140 can be sawed, thereby separating the resultant product into individual semiconductor devices 300. In some examples, the sawing process of separating the resultant product into individual semiconductor devices 300 can be referred to as a singulation process.

For example, some regions of encapsulant 370, substrate 110, leadframe 360 and encapsulant 140 can be removed by a diamond wheel, laser beam or etching, thereby completing individual semiconductor devices 300. Each of completed individual semiconductor devices 300 can include substrate 110, electronic device 120, passive device 130, encapsulant 140, electronic device 150, leadframe 360 and encapsulant 370. In addition, in the singulation process, dam bars 364 connecting the plurality of leads 362 to tie bars 363 can be removed, thereby electrically disconnecting the plurality of leads 362 from paddle 361.

In summary, a semiconductor device comprises a substrate having a top surface and a bottom surface, and an electronic device on the bottom surface of the substrate, a leadframe on the bottom surface of the substrate. The leadframe comprises a paddle, wherein the paddle is coupled to the electronic device, and a lead electrically coupled to the electronic device. The semiconductor device further comprises a first protective material contacting the bottom surface of the substrate and a side surface of the electronic device.

A method of manufacturing a semiconductor device comprises placing a plurality of electronic devices on a bottom surface of a substrate strip, placing a leadframe on the bottom surface of the substrate strip, wherein the leadframe comprises a plurality of paddles and a plurality of leads, wherein a paddle of the plurality of the paddles contacts an electronic device of the plurality of electronic devices and a lead of the plurality of leads is electrically coupled to an electronic device of the plurality of electronic devices, and forming a first protective material on the bottom surface of the substrate strip to contact a side surface of an electronic device.

A semiconductor device comprises a substrate having a top surface and a bottom surface, a first electronic device on the top surface of the substrate, a second electronic device on the bottom surface of the substrate, a heat sink thermally coupled to the second electronic device, a contact electrically coupled to the second electronic device, and a mold compound contacting the bottom surface of the substrate and a side surface of the second electronic device, wherein a surface of the contact is substantially coplanar to a surface of the heat sink and a surface of the mold compound.

The present disclosure includes reference to certain examples, but it will be understood, however, by those skilled in the art that various changes may be made, and equivalents may be substituted, without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

The invention claimed is:

1. A semiconductor device, comprising:
a substrate comprising a dielectric structure, a conductive structure, a first side, and a second side opposite to the first side;
a first electronic device coupled with the substrate, wherein the first electronic device comprises an active device;
a second electronic device coupled with the substrate, wherein the second electronic device comprises an active device;
a heat sink comprising a first side oriented away from the substrate and a second side oriented toward the substrate; and
an encapsulant covering the substrate and covering a lateral side of the heat sink;
wherein the first side of the heat sink is exposed from an external side of the encapsulant; and
wherein the heat sink covers a top side of the first electronic device and a top side of the second electronic device is not covered by any heat sink.

2. The semiconductor device of claim 1, wherein the first side of the heat sink is coplanar with the external side of the encapsulant.

3. The semiconductor device of claim 1, wherein the encapsulant extends between the substrate and the first electronic device.

4. The semiconductor device of claim 1, wherein:
the first electronic device is coupled with the first side of the substrate; and
the heat sink covers the first electronic device, and the second side of the heat sink is oriented toward the first electronic device.

5. The semiconductor device of claim 1, wherein:
the first electronic device is coupled with the first side of the substrate; and
the second electronic device is coupled with the first side of the substrate;
wherein the encapsulant covers a lateral side of the first electronic device and a lateral side of the second electronic device.

6. The semiconductor device of claim 1, comprising:
a lead coupled with the conductive structure of the substrate;
wherein the lead is in the encapsulant.

7. A semiconductor device, comprising:
a substrate comprising a dielectric structure, a conductive structure, a first side, and a second side opposite to the first side;
a plurality of electronic devices coupled with the substrate, wherein each of the plurality of electronic devices comprises an active device having an interconnect facing the substrate;
a heat sink having a first side oriented away from the substrate and a second side oriented toward the substrate, wherein the heat sink covers at least one of the plurality of electronic devices, and at least another one of the plurality of electronic devices is not covered by the heat sink; and
an encapsulant covering the substrate, a lateral side of at least one of the plurality of electronic devices, and a lateral side of the heat sink;
wherein the first side of the heat sink is exposed from an external side of the encapsulant.

8. The semiconductor device of claim 7, wherein the first side of the heat sink is coplanar with the external side of the encapsulant.

9. The semiconductor device of claim 7, wherein the encapsulant extends between the substrate and at least one of the plurality of electronic devices.

10. The semiconductor device of claim 7, wherein:
at least one of the plurality of electronic devices is coupled with the first side of the substrate; and
at least another one of the plurality of electronic devices is coupled with the second side of the substrate.

11. The semiconductor device of claim 7, wherein:
at least one of the plurality of electronic devices is coupled with the first side of the substrate; and
at least another one of the plurality of electronic devices is coupled with the first side of the substrate.

12. The semiconductor device of claim 7, wherein:
the encapsulant covers a top side of at least one of the plurality of electronic devices.

13. The semiconductor device of claim 7, comprising:
a lead coupled with the conductive structure of the substrate;
wherein the lead is in the encapsulant.

14. A method to manufacture a semiconductor device, comprising:
providing a substrate comprising a dielectric structure, a conductive structure, a first side, and a second side opposite to the first side;
providing a plurality of electronic devices coupled with the substrate, wherein each of the plurality of electronic devices comprises an active device having an interconnect facing the substrate;
providing a heat sink having a first side oriented away from the substrate and a second side oriented toward the substrate, wherein the heat sink covers at least one of the plurality of electronic devices, and at least another one of the plurality of electronic devices is not covered by the heat sink; and
providing an encapsulant covering the substrate, a lateral side of at least one of the plurality of electronic devices, and a lateral side of the heat sink;
wherein the first side of the heat sink is exposed from an external side of the encapsulant.

15. The method of claim 14, wherein the first side of the heat sink is coplanar with the external side of the encapsulant.

16. The method of claim 14, wherein the encapsulant extends between the substrate and at least one of the plurality of electronic devices.

17. The method of claim 14, wherein:
at least one of the plurality of electronic devices is coupled with the first side of the substrate; and
at least another one of the plurality of electronic devices is coupled with the second side of the substrate.

18. The method of claim 14, wherein:
aat least one of the plurality of electronic devices is coupled with the first side of the substrate; and
at least another one of the plurality of electronic devices is coupled with the first side of the substrate.

19. The method of claim 14, wherein:
the encapsulant covers a top side of at least one of the plurality of electronic devices.

20. The method of claim 14, comprising:
a lead coupled with the conductive structure of the substrate;
wherein the lead is in the encapsulant.

* * * * *